(12) United States Patent
Robertson et al.

(10) Patent No.: US 7,493,226 B2
(45) Date of Patent: Feb. 17, 2009

(54) METHOD AND CONSTRUCT FOR ENABLING PROGRAMMABLE, INTEGRATED SYSTEM MARGIN TESTING

(75) Inventors: Naysen Jesse Robertson, Orangeville, CA (US); Benjamin Thomas Percer, Roseville, CA (US); Sachin N. Chheda, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 575 days.

(21) Appl. No.: 10/606,714

(22) Filed: Jun. 26, 2003

(65) Prior Publication Data

US 2004/0267482 A1 Dec. 30, 2004

(51) Int. Cl.
*G01R 23/00* (2006.01)
*G01R 31/00* (2006.01)

(52) U.S. Cl. ............... 702/106; 702/117; 714/724; 324/537

(58) Field of Classification Search ........... 702/108, 702/118, 120–122, 124, 185, 188; 365/200–201; 714/11, 42, 717, 724, 742; 324/537
See application file for complete search history.

(56) References Cited

U.S. PATENT DOCUMENTS

| | | | | |
|---|---|---|---|---|
| 4,773,094 A * | 9/1988 | Dolby | ............ | 381/58 |
| 5,119,021 A | 6/1992 | Taraci et al. | ............ | 324/158.1 |
| 5,157,326 A | 10/1992 | Burnsides | ............ | 324/537 |
| 5,455,931 A * | 10/1995 | Camporese et al. | ............ | 713/501 |
| 5,663,968 A * | 9/1997 | Heuer | ............ | 714/745 |
| 5,675,807 A | 10/1997 | Iswandhi et al. | ............ | 710/260 |
| 6,000,040 A | 12/1999 | Culley et al. | ............ | 714/31 |
| 6,316,988 B1 | 11/2001 | Forehand et al. | ............ | 327/538 |
| 6,351,827 B1 | 2/2002 | Co et al. | ............ | 714/42 |
| 6,385,125 B1 * | 5/2002 | Ooishi et al. | ............ | 365/233 |
| 6,476,615 B1 | 11/2002 | Marbot et al. | ............ | 324/537 |
| 6,496,790 B1 | 12/2002 | Kathavate et al. | ............ | 702/188 |
| 6,546,507 B1 | 4/2003 | Coyle et al. | ............ | 714/43 |

(Continued)

FOREIGN PATENT DOCUMENTS

EP 0 505 120 9/1992

(Continued)

OTHER PUBLICATIONS

Xicor Data Sheet: "X9409 Preliminary Information: Quad Digitally Controlled Potentiometers." Rev 1.3, Oct. 23, 2001.

(Continued)

*Primary Examiner*—Hal D Wachsman
*Assistant Examiner*—Mary C Baran

(57) ABSTRACT

The present invention provides a margin testing system, incorporated in an electronic system (e.g., a computer system), that includes a controller, a frequency control module, and a voltage control module, and a fault bypass module. In response to commands from the controller, the frequency control module and/or the voltage control module can set a test clock frequency and/or a test voltage for application to one or more components of the electronic system to elicit system response to these test values. The response of the system at each test value can be monitored, e.g., by executing a diagnostics software, and analyzed. The fault bypass module can mask fault signals during margin testing to ensure that these signals will not disrupt margin testing of the system.

16 Claims, 17 Drawing Sheets

U.S. PATENT DOCUMENTS

| | | | |
|---|---|---|---|
| 6,563,350 B1 | 5/2003 | Warner et al. | 327/107 |
| 6,564,350 B1 | 5/2003 | Hoeweler | 714/742 |
| 6,617,872 B2 * | 9/2003 | Vogley | 324/765 |
| 6,667,917 B1 | 12/2003 | Templeton et al. | 365/201 |
| 6,697,952 B1 | 2/2004 | King | 713/300 |
| 6,856,926 B2 * | 2/2005 | Monfared et al. | 702/75 |
| 2003/0101020 A1 | 5/2003 | Matsushige | 702/185 |
| 2003/0130969 A1 | 7/2003 | Hawkins et al. | 706/15 |
| 2004/0249913 A1 | 12/2004 | Kaufman | 709/223 |
| 2004/0267482 A1 | 12/2004 | Robertson et al. | 702/118 |
| 2005/0080887 A1 | 4/2005 | Lee et al. | 709/223 |

FOREIGN PATENT DOCUMENTS

| | | |
|---|---|---|
| GB | 1 219 001 | 1/1971 |
| JP | 62-262165 | 11/1987 |
| JP | 5-2502 | 1/1993 |
| JP | 2000172536 | 6/2000 |

OTHER PUBLICATIONS

Philips Semiconductors Data Sheet: "PCF8575C: Remote 16-bit I/O Expander for 12C-bus." Aug. 5, 1999.

Integrated Circuit Systems, Inc. Data Sheet: "ICS8431-11: 255MHz, Low Jitter, Crystal Oscillator-to-3.3v LVPECL Frequency Synthesizer." Rev. B, Aug. 7, 2002.

AMI Semiconductor Datasheet: "FS7140/FS7145: Programmable Phase-Locked Loop Clock Generator." Feb. 27, 2002.

National Semiconductor Data Sheet: "LM87: Serial Interface System Hardware Monitor with Remote Diode Temperature Sensing." Mar. 2001.

UK Search Report; Application No. GB0413502.6, Nov. 9, 2004.

Tsukude, et al. "Highly Reliable Testing of ULSI Memories with On-Chip Voltage-Down Converters". IEEE Design & Test Of Computers. Jun. 1993, pp. 6-12.

Berner, et al. DC Voltage Margin Tester:. NB84092465. IBM Technical Disclosure Bulletin, vol. 27, No. 4B, Sep. 1984, p. 246.

Great Britain Search Report. Application No. GB0413503.4. Oct. 27, 2004.

Great Britain Search Report. Application No. GB 0413501.8. Nov. 5, 2004.

"Failure logging system includes diagnostic controller which releases interruption to output interrupt signal to CPU, when completion response signal is not received", NEC CORP, JP2000172536A, Jun. 23, 2000, English Translation.

Winbond news article, p. 1, Mar. 8, 2001.

* cited by examiner

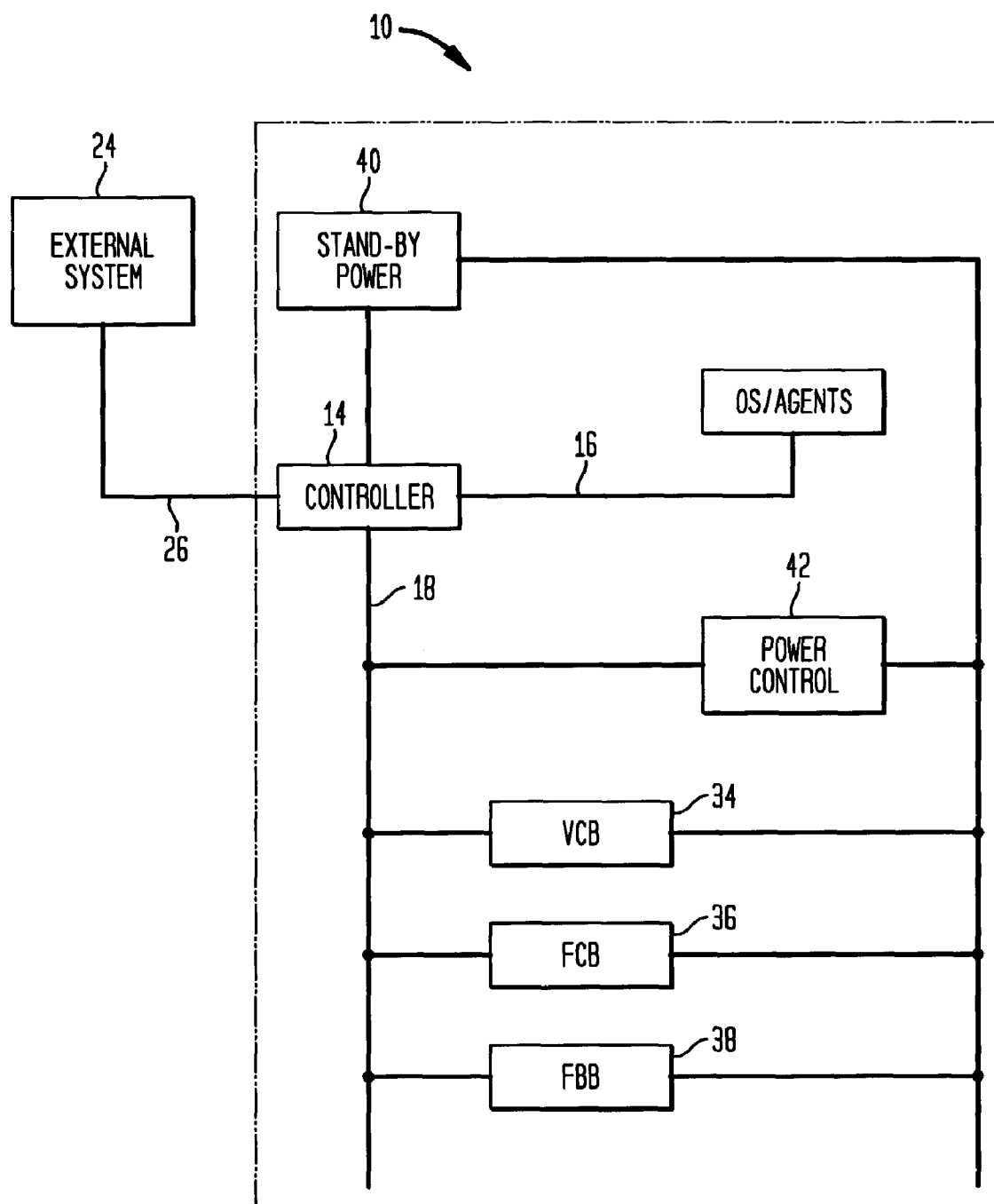

METHOD AND CONSTRUCT FOR ENABLING PROGRAMMABLE, INTEGRATED SYSTEM MARGIN TESTING

RELATED APPLICATIONS

The present application is related to the following commonly owned U.S. Patent Applications, incorporated in their entirety herein by reference:

U.S. patent application Ser. No. 10/606,463 filed Jun. 26, 2003, entitled "USE OF I²C-BASED POTENTIOMETERS TO ENABLE VOLTAGE RAIL VARIATION UNDER BMC CONTROL," naming as inventors Benjamin T. Percer, Naysen J. Robertson and Akbar Monfared; U.S. patent application Ser. No. 10/606,713 filed Jun. 26, 2006, entitled "METHODS AND SYSTEMS FOR MASKING FAULTS IN A MARGIN TESTING ENVIRONMENT" naming as inventors Benjamin T. Percer and Naysen J. Roberston; and U.S. patent application Ser. No. 10/606,713 filed Jun. 26, 2003, entitled "USE OF I²C PROGRAMMABLE CLOCK GENERATOR TO ENABLE FREQUENCY VARIATION UNDER BMC CONTROL," naming as inventors Naysen J. Robertson, Benjamin T. Percer, and Kirk Yates.

BACKGROUND

The present invention relates generally to systems and methods for monitoring and testing various modules in an electronic system, such as a computer system. More particularly, the invention provides methods and systems for enabling programmable, integrated margin testing of a computer system.

Electronic systems often include a myriad of subsystems and components that require monitoring and/or testing during development and/or manufacturing while in use in the field to ensure their proper operation within specified operating conditions. Many of these components typically exhibit subtle failures at margins or extremes of such specified operating conditions. Hence, it is desirable to test a system to variations of operating conditions, such as, ambient temperature, clock frequencies and power rail voltages, associated with selected components thereof, during development and manufacturing, to ensure system reliability. Such testing of a system, especially at the extremes or margins of the operating conditions, is herein referred to as margin testing. Margin testing can also ensure that a particular design can be readily adapted to evolving changes in manufacturing processes.

Traditionally, circuitry for margin testing is implemented by providing a plurality of access points in a system under test (SUT) that allow external adjustment of the system's power rail voltages, and input of alternate wave functions for distribution to the system's fundamental clock networks. Such traditional approaches, however, suffer from a number of shortcomings. For example, such approaches typically require physical modification of the SUT, e.g., physical switching of various components for selecting different frequencies, that may lead to accidental damage and/or unreliable test results. Further, such approaches typically require multiple manufacturing "load-options" to bypass the system's integral fault trigger circuits during testing, and additional ports for providing feedback to an external test system, thereby adding to the complexity and expense of margin testing.

Moreover, external test systems can be expensive, and are often large and utilize valuable floor space. In addition, such external test systems require control software to manage, monitor and control analog/digital function generators, thereby adding complexity to the process of synchronizing the SUT's operation with specific control inputs issued by the external test system. Moreover, the use of an external test system can render generation and testing of scripts for margin testing more complicated. In particular, test scripts must execute additional control commands to interface with the test station, e.g., the test system's generators that provide various stimuli to the SUT.

Another disadvantage of such traditional margin testing systems relates to a high level of hardware specificity that causes such systems to be generally non-extensible. For example, in such traditional margin testing systems, the processes and procedures utilized for margin testing of a present SUT can not be readily extended to processes and procedures suitable for margin testing of a future version of the SUT.

Hence, there is a need for enhanced systems and methods for readily performing margin testing of a computer system. There is also a need for such systems and methods that allow margin testing without a need for physical modifications of the system under test.

SUMMARY OF THE INVENTION

In one aspect, the present invention provides a system for margin testing of selected components and/or subsystems of an electronic system, such as a computer system (e.g., a server), that includes a controller, such as a Baseboard Management Controller (BMC), internal to the electronic system under test and a digital parameter adjuster in communication with the controller, for example, via an I²C-based bus. The digital parameter adjuster can communicate with one or more components and/or subsystems of the electronic system under test to apply an operating parameter, e.g., clock frequency or voltage, thereto. Further, the parameter adjuster, in response to command signals from the controller, can set the applied operating parameter to one or more test values in order to elicit response of these components, or other components/subsystems of the system, to such parameter variation.

In further aspects, the invention provides a margin testing system, incorporated in a computer system that requires testing, that includes a controller, a frequency control module, and a voltage control module. In response to commands from the controller, the frequency and/or the voltage control modules can set a clock frequency and/or a voltage applied to one or more components of the system to one or more test values to elicit system response at these test values. The margin testing system can further include a fault bypass module, which is in communication with the controller, for disabling selected automatic fault response mechanisms of the computer system during margin testing.

In other aspects, the invention provides a method for frequency margin testing of one or more marginable components of a computer system in which an internal controller and a frequency control module, in communication with the controller and configured to apply clock frequency to the marginable components, are incorporated according to the teachings of the invention. For each of a plurality of frequency test values, the controller is caused to transmit a command to the frequency control module to set its output frequency to a test value. The response of the system is then monitored at each test value.

In another aspect, the invention provides a method for voltage margin testing of a computer system in which an internal controller and a voltage control module, in communication with the controller and configured to apply voltages to one or more power rails of the computer system, are incorporated according to the teachings of the invention. For each of a plurality of voltage test values, the controller is caused to transmit a command to the voltage control module for setting voltages of the power rails to one or more test values. The response of the computer system is then monitored at each test value.

In another aspect, the invention provides a method for frequency margin testing of a computer system in which an internal controller and a frequency control module, in communication with the controller and configured to apply test clock frequencies to marginable components, are incorporated in accordance with the teachings of the invention. The controller is programmed to issue a sequence of commands to the frequency control module in response to a signal for initiating frequency margin testing. Each command causes the frequency control module to set its output frequency to one of a plurality of frequency test values. A signal can be transmitted to the controller, for example, from an external system, to cause the controller to execute the programmed sequence of commands, thereby initiating margin testing of the system. The response of the computer system can then be monitored at each test frequency.

Further understanding of the invention can be obtained by reference to the following detailed description in conjunction with associated drawings, which are briefly described below.

DETAILED DESCRIPTION

The present invention relates generally to improved systems and methods for margin testing of selected components and/or subsystems of an electronic device, such as a computer system (e.g., a server) or a network switch. As discussed in detail below, a margin testing system according to the teachings of the invention can include a digital parameter adjuster, such as a digital frequency synthesizer or a digital potentiometer, that operates under control of a controller. The parameter adjuster can vary the value of ("step") an operating parameter of interest, e.g., frequency or voltage, associated with selected components of the computer system through a plurality of test values in response to commands from the controller. More particularly, the output of the parameter adjuster, and hence the value of the operating parameter applied to one or more components under test, can be varied over a selected range, via command signals from the controller, and the response of the system can be collected, monitored and/or analyzed.

Although the following embodiments of margin testing systems of the invention are described with reference to computer systems, it should be understood that margin testing systems according to the teachings of the invention can also be incorporated in other electronic systems, such as, network switches, for which margin testing is needed.

Figure 1A:
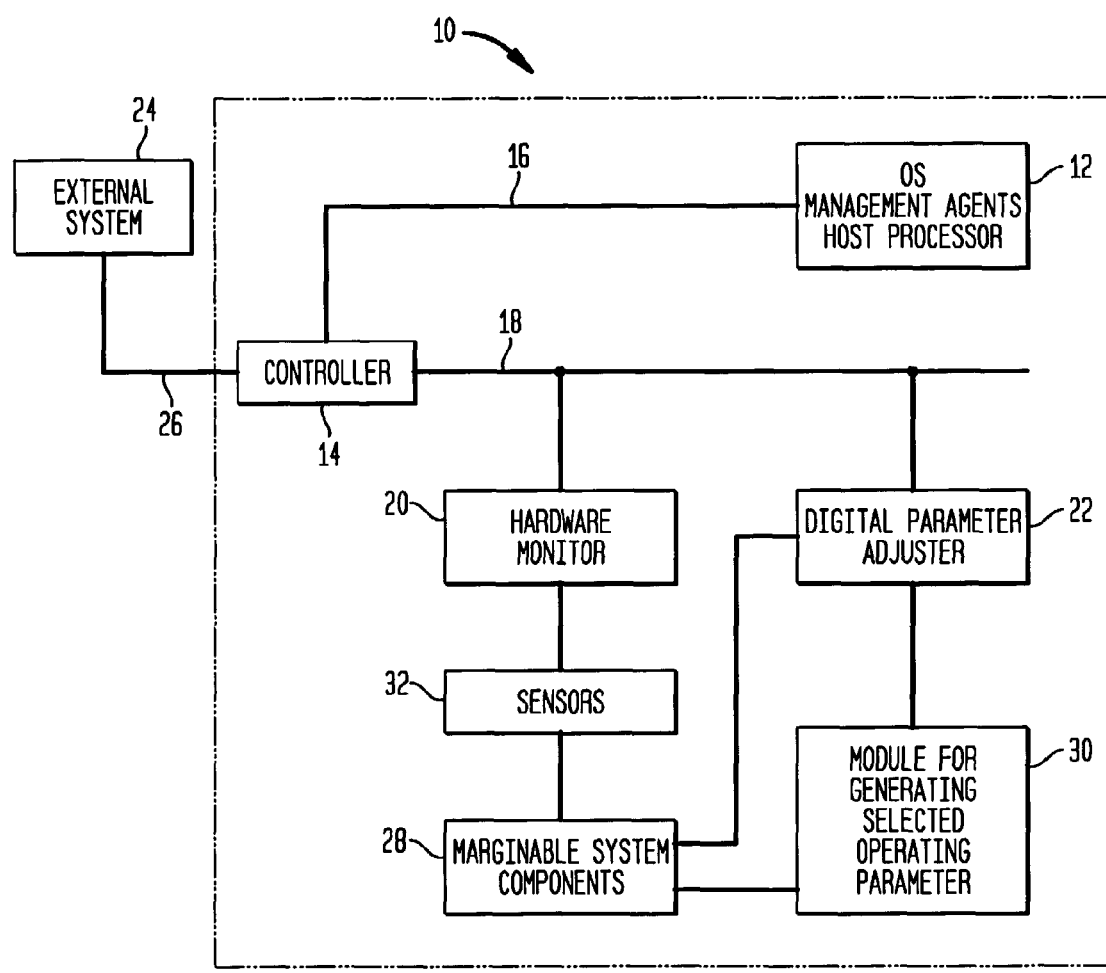
FIG. 1A schematically depicts a margin testing system according to one embodiment of the teachings of the invention incorporated into a computer system for testing selected components thereof.

FIG. 1A schematically illustrates an exemplary computer system 10 in which a margin testing system according to the teachings of the invention is incorporated. The computer system 10 can be, for example, a server computer system which is generally understood in the art to be a system configured, by hardware and/or software, to provide a high degree of performance in communications with other computer systems over a communications network, or any other computer system for which margin testing is needed. Although the exemplary computer system 10 includes a single host processor 12, it should be understood that a margin testing system according to the teachings of the invention can also be incorporated in multi-processor systems.

The exemplary computer system 10 includes a controller 14 that can provide a plurality of management functions, as described below, and is in communication, via a system interface 16, with the host processor 12 on which an operating system (OS) and one or more management agents run. The system interface 16 can be, for example, any suitable communications bus, such as a PCI bus.

The controller 14 can be implemented, for example, as an application specific integrated circuit (ASIC), or alternatively, it can consist of several different chips. By way of example, in some embodiments of the invention described in more detail below, the controller 14 can be an intelligent processing controller, commonly referred to as Baseboard Management Controller (BMC) that can support Intelligent Platform Management Interface (IPMI) protocol. The IPMI protocol is an open standard that provides a standardized message interface between a management application running on a host processor and the hardware platform.

The exemplary controller 14 can communicate, via a communications bus 18, with a hardware monitor module 20 and a digital parameter adjuster module 22 to transmit command signals to these modules and/or to receive information therefrom. The communications bus 18 can be any suitable proprietary or public bus. For example, in embodiments in which the controller is BMC, the bus 18 can be a private $I^2C$ (Inter-Integrated Circuit) bus or an Intelligent Platform Management Bus (IPMB). Alternatively, the bus 18 can be an ASA or a USB bus, or any other suitable communications bus.

Moreover, the controller 14 can communicate with an external system 24, via a bus 26, that can instruct the controller to initiate margin testing of the device 10. The external system 24 can be, for example, a terminal that can communicate with the controller via a bus, such as, an RS232 bus. Alternatively, the external system 24 can be a remote computer that can communicate with the controller 14 via a computer network connection, such as, a LAN-based Ethernet connection. The bus 26 can be any suitable bus, such as, a LAN-based Ethernet connection. The controller can also initiate margin testing in response to setting of a switch or a jumper.

The system 10 further includes a plurality of other subsystems and components that cooperatively provide the system's functionality. Many of these subsystems or components require monitoring and/or testing during development, manufacturing and/or in the field to ensure proper design and/or operation of the computer device. More specifically, many of these components require margin testing to ensure their reliability under various operating conditions. Such components 28 for which margin testing is desired, herein referred to as marginable components, can include, for example, central processing units (CPU), memory modules, internal communication buses, voltage regulators, or any other component or subsystem of components of interest for which margin testing may be required.

The digital parameter adjuster 22 can adjust a selected operating parameter of one or more of the marginable components 28 directly, e.g., to adjust clock frequency, or via one or more intermediate modules 30 that generate a selected operating parameter for application to these components. For example, in some embodiments, described in more detail below, in which the parameter adjuster is a digital potentiometer, the intermediate module can be a voltage regulator whose output can be adjusted by varying the resistance of the digital potentiometer under commands from the controller.

The hardware monitor 20 can monitor the components in real time through sensors 32 associated with specific component properties, e.g., voltage, temperature, operating frequency, etc. The sensors 32 can generate data indicative of the response of the components 28 to variation of one or more operating parameters, such as, temperature, voltage, or driving frequency. The hardware monitor 20 receives this response data, and can transmit the data to the controller 14 for analysis, as discussed in more detail below. Although in this schematic illustration, the sensors 32 and the hardware monitor 20 are shown as separate modules, those having ordinary skill in the art will appreciate that some or all of the sensors can be integrated in the hardware monitor.

With continued reference to FIG. 1A, the digital parameter adjuster 22 can effect variation of an operating parameter associated with one or more of the marginable components, either directly or via the intermediate module 30, over a selected range of values. More particularly, the controller 14 can transmit command signals to the digital parameter adjuster 22 to instruct the adjuster to vary the value of a selected operating parameter associated with one or more of the components 28.

Figure 1B:
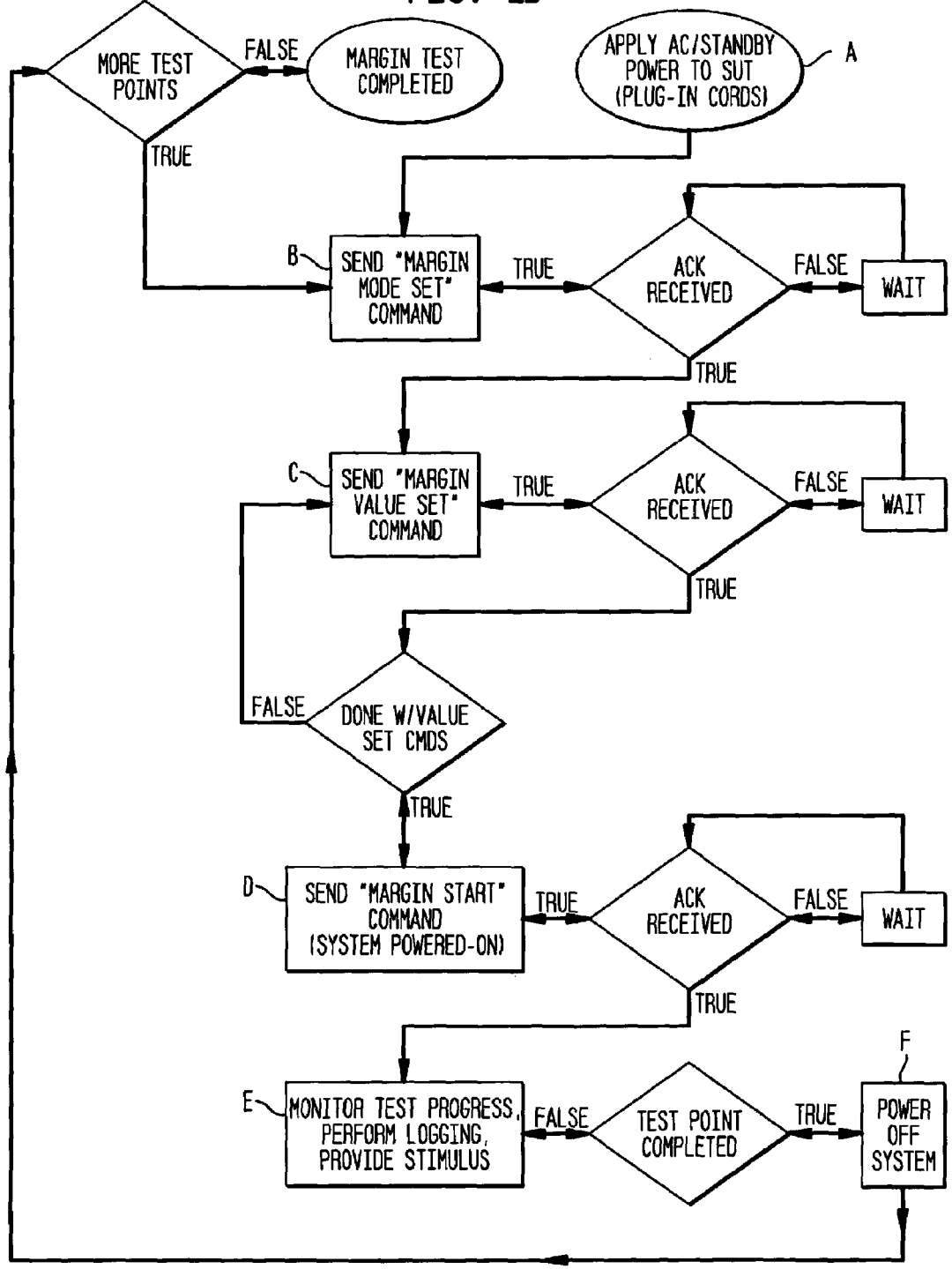
FIG. 1B is a flow chart depicting the steps in one embodiment of a method of the invention for margin testing of a selected operating parameter of a computer system, FIG. 2 schematically depicts a computer system in which a margin testing system according to one embodiment of the invention, having a frequency control module, a voltage control module and a fault bypass module, is incorporated, FIG. 3 schematically depicts that a voltage control module of the testing system of FIG. 2 can be utilized for voltage margin testing of selected components of the computer system, FIG. 4A schematically depicts an exemplary implementation of an FBB module according to one embodiment of the invention, FIG. 4B schematically depicts the use of an FBB module in combination with a hardware monitor to mask selected faults during margin testing of a computer system in which a margin testing system according to one embodiment of the invention is incorporated, FIG. 5 schematically depicts the incorporation of a margin testing system according to one embodiment of the invention in a server employing an IPMI protocol.

For example, with reference to the flow chart of FIG. 1B, in step A, standby power is applied to the system under test with the system's primary power source off. In step B, a "Margin Mode Set" command is transmitted to the BMC, e.g., from an external system, to instruct the BMC to initiate margin testing. Upon receipt of an acknowledgement from the BMC, a "Margin Value Set" command is transmitted to the BMC to instruct the BMC to set the value of an operating parameter under test, e.g., voltage or frequency, to a test value (step C). Step C can be repeated until all margin parameter values have been transmitted to the SUT and respectively acknowledged. Subsequently, in step D, a "Margin Start Command" is transmitted to the BMC to cause it to power the system, i.e., switch on the system's primary power source. In step E, the progress of the test is monitored and logged. Upon completion of the test at this test point, the primary power is switched off (step F), and the above procedure is repeated for other test points, if desired, until data at all test points are collected.

In some embodiments, power can remain on through the margin configuration phase, thus eliminating the need to switch off the system power (step F), although the computer system should be designed to withstand dynamic variance to the affected parameters for enabling this approach. Acknowledgements are used to guarantee synchronicity of the BMC and a margin test station that issues commands. The test station will poll the BMC for acknowledgement after issuance of each command that requires a response. If no response is received within a pre-defined period, the test station may re-send the command, process a defined exception sequence, or time-out or halt with a fail exit code.

The use of a digital parameter adjuster internal to a computer system under test and responsive to command signals from an internal controller of such a computer system provides a number of advantages. For example, it allows margin testing without a need for invasive physical modifications of the system, such as, the use of jumpers and resistor banks. Further, it obviates the need for external test equipment and lengthy set-up time for testing. In addition, it can allow testing under software control without human intervention. Moreover, the digital parameter adjuster can be readily selected to provide a requisite resolution for variation of an operating parameter of interest.

Further, the incorporation of a margin testing system according to the teachings of the invention in a computer system advantageously provides non-invasive approaches to address and fix design defects in post production. For example, if an ASIC, due to a bug, is found to require a VIO voltage that is a few percent above a normal value, a voltage margin testing system of the invention, such as those described in detail below, can be employed to supply the requisite voltage to this ASIC. Further, the use of programmable elements, such as a programmable frequency synthesizer, in margin testing systems of the invention facilitates follow-up platform designs. That is, the same frequency synthesizer can be utilized in a follow-on design, which, for example, increases front-side bus frequency, thus simplifying the follow-on design and mitigating risks associated with design change and generally reducing associated costs of material procurement.

Referring to FIG. 2, the controller 14 can initiate and accomplish margin testing of the marginable components of the computer system 10 without a need to interact with the management agents running on the operating system 12. In other words, the controller 14 can provide out-of-band system monitoring. The term out-of-band refers to elements of a computer system that are capable of operating independently of operating system's (OS) control and/or intervention. If needed, the controller 14 can communicate with these management agents to provide in-band system monitoring.

Typically, out-of-band operation is preferable for performing margin testing of a computer system because the system's OS and its agents can be susceptible to crashes and other aberrant behavior under stresses associated with margin testing. It is desirable to monitor and log the progress of a margin test. For example, if a failure occurs at a test point, it is desirable to log information regarding the test point and other related data. An out-of-band agent, such as a BMC that is powered by a non-margined voltage rail, e.g., a stand-by power source, will not be affected by system level margin settings, and hence will be available to perform such monitoring and logging of a margin test.

A margin testing system according to the teachings of the invention can be implemented in a variety of different ways to allow programmable integrated margin testing of a computer system, e.g., a server. By way of example, FIG. 2 schematically illustrates one embodiment of a margin testing of the invention incorporated in the computer system 10 that includes, in addition to the controller 14, a voltage control block/module (VCB) 34, a frequency control block/module (FCB) 36, and a Fault bypass block (FBB) 38. In response to commands from the controller 14, the VCB 34, the FCB 36 and the FBB 38 can be employed, respectively, for voltage margin testing, frequency margin testing, and for selectively masking automatic mechanisms integrated in the system under test (SUT) for responding to faults during margin testing. Although this exemplary margin testing system includes both a frequency and a voltage control block, other embodiments may include only a voltage control module or a frequency control module.

Each margin testing block 34, 36, and 38 incorporates devices and associated circuitry required for performing margin testing of selected components of the server under control of the controller 14. Exemplary implementations of each of these modules are provided further below.

With continued reference to FIG. 2, the controller 14 can communicate with each of the VCB, FCB, and FBB modules via the bus 18 to transmit commands thereto. The bus 18 can be any suitable bus for providing communication between the controller and these modules. For example, in some embodiments of the invention described below, the bus 18 is an I²C private bus. In addition, the controller 14 can communicate via the system interface 16, e.g., a PCI bus, to the server's operating system and one or more management agents.

A stand-by power source 40 can provide power to the controller 14 to ensure that the controller can function when the system's primary power source (not shown) is switched off. In addition, the stand-by power source 40 can supply power to other elements, such as VCB 34, FCB 36, and FBB 38, that participate in margin testing of the computer system.

Further, the controller 14 can transmit commands to a power control circuitry 42 via the bus 18 to control switching the server's primary power source from on to off and vice versa.

The external system 22, which can be, for example, a user or a script entity, can transmit commands to the controller 14 for initiating margin testing of the server. More particularly, the external system 22, via a user or a preprogrammed instruction set, can transmit a command to the controller 14 to cause the controller to initiate margin testing of selected components of the server. Such a margin test is typically initiated with the primary power off, and with the stand-by source providing power to the controller, and to the ancillary margin testing blocks, e.g., the VCB 34, the FCB 36, and the FBB 38. In response to commands from the external system 22, the controller transmits command signals to one or more margin testing blocks, such as, the VCB, FCB, and/or FBB to effect resumption of testing of marginable components of the server. Typically, the controller 14 instructs the FBB 38 to mask selected faults during the performance of the margin test, as discussed in more detail below.

In many embodiments of the invention, the controller 14 includes firmware that can be programmed to step the voltage or the frequency applied to marginable components of a system under test through a discrete number of pre-defined values, upon initiation of margin testing. Alternatively, upon initiation of margin testing, the external system 22 can transmit a series of commands to the controller, each of which can instruct the controller to set the frequency or voltage to a desired test value. At each value of the voltage or frequency, the system's response can be monitored and analyzed.

With continued reference to FIG. 2, in response to commands from the controller, the margin test module 36 can adjust clock frequency applied to selected components, such as, CPUs or synchronous buses, and the VCB module 34 can adjust voltages of selected power rails, as discussed in more detail below. For example, the FCB 36 can step the clock frequency through a number of discrete values spanning a selected range, and the VCB can step voltages of selected rails through a discrete set of values. At each value of the clock frequency or the rails voltage, the response of the system can be monitored and recorded.

In preferred embodiments of the invention, components and subsystems for which margin testing can be performed, i.e., marginable components, default to a nominal state until instructed, for example, by the controller 14, to do otherwise. For example, rails voltages default to nominal values unless programmed, for example, via the VCB, to deviate from these values. Furthermore, these default values can be re-set when the system power is cycled.

Figure 3:
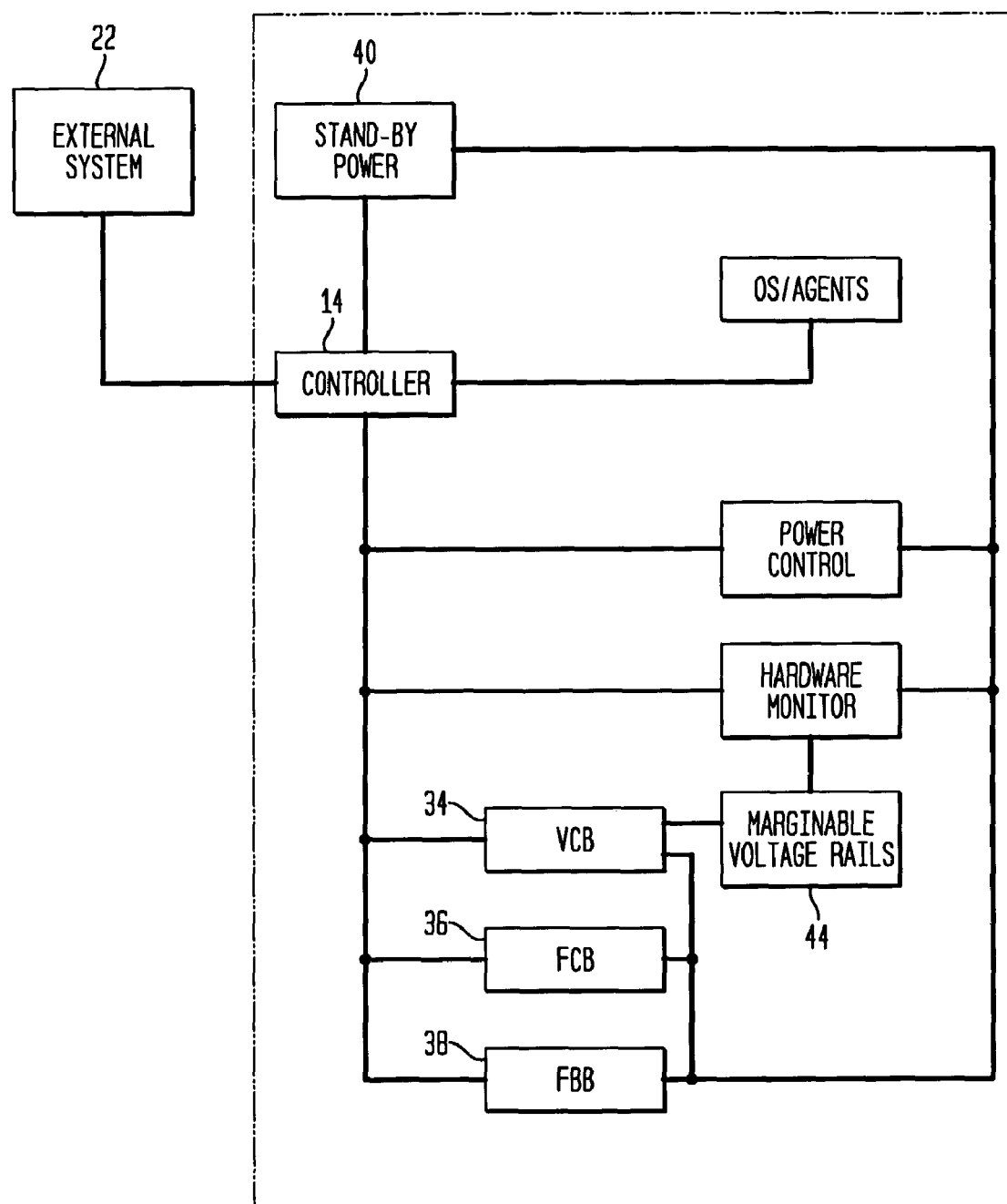

With reference to FIG. 3, the VCB module 34 can be employed to adjust voltages of selected rails 44, herein also referred to as marginable voltage rails, in response to margin test commands from the controller 14.

The voltage control block 34 can be implemented in a variety of different ways. In one such implementation, which is described in more detail below (See FIGS. 10 and 11), the VCB 34 can include a digital potentiometer that is incorporated into a resistive feedback circuitry of a voltage regulator whose output corresponds to a rail voltage. In response to commands from the controller, the digital potentiometer can vary resistance of the regulator's feedback circuit, thereby varying the regulator's output voltage.

Referring again to FIG. 2, the FCB 36 module can also be implemented in a variety of different ways. For example, in one implementation described in detail further below with reference to FIG. 5, the FCB 36 can include a digital frequency synthesizer whose output frequency, which can be applied to selected marginable system components, can be varied in response to commands from the controller. In this manner, one or more margin test frequencies can be applied to system components, such as, CPU's, for which frequency margin testing is desired.

With continued reference to FIG. 2, the fault bypass block 38 can mask selected faults during margin testing in order to ensure that automatic response fault mechanisms integrated into the computer system 10 would not adversely affect margin testing of the system. Such automatic response fault mechanisms can provide environmental safeguards, for example, temperature monitoring via diodes, or relate to over/under-voltage "power-good" reset circuits, or any hotswap "healthy" outputs that may cause a system reset, or other similar mechanisms. As discussed in more detail below, the FBB 38 can employ digital enable/disable signals to disable selective fault lines during margin testing, and re-enable them once the test is completed. Similar to the other margin testing modules described above, the FBB can receive power from the stand-by power source to be able to operate when the main power source is off for margin testing.

Figure 4A:
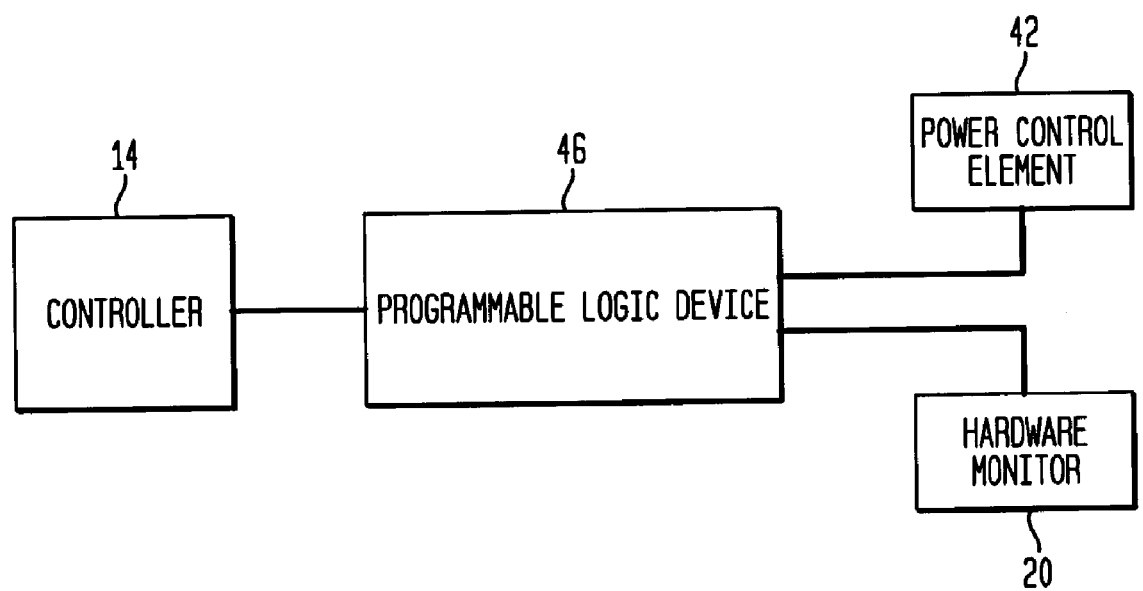

By way of example, with reference to FIG. 4A, one implementation of the FBB 36 can include a programmable logic device (PLD) 46 that receives signals from the controller to disable selective automatic fault response mechanisms. For example, the controller 14 can instruct the PLD 46 to operate in "margin mode" in which the PLD can intercept and mask selected fault interrupts that can be generated in the system under test. In this example, the PLD can communicate with a hardware monitor 20 to receive/intercept signals that are normally indicative of faults in the system, and to selectively mask these signals when margin testing of the computer system is in progress. For example, as discussed in more detail below, when operating in margin mode, the PLD 46 can provide appropriate signals to the power control element 42 to ensure that it will not power down the computer system when voltage margin testing of selected power rails of the computer system is in progress. In the absence of margin testing, that is, when the PLD is not operating in margin mode, it will pass fault signals, received from the hardware monitor 20, to the power control element 42 to ensure that appropriate actions will ensue when a valid voltage fault occurs. A number of commercially available PLDs can be employed in the practice of the invention. For example, a PLD marketed by Altera Corporation of San Jose, Calif., U.S.A. under the trade designation MAX 7000B can be employed.

Figure 4B:
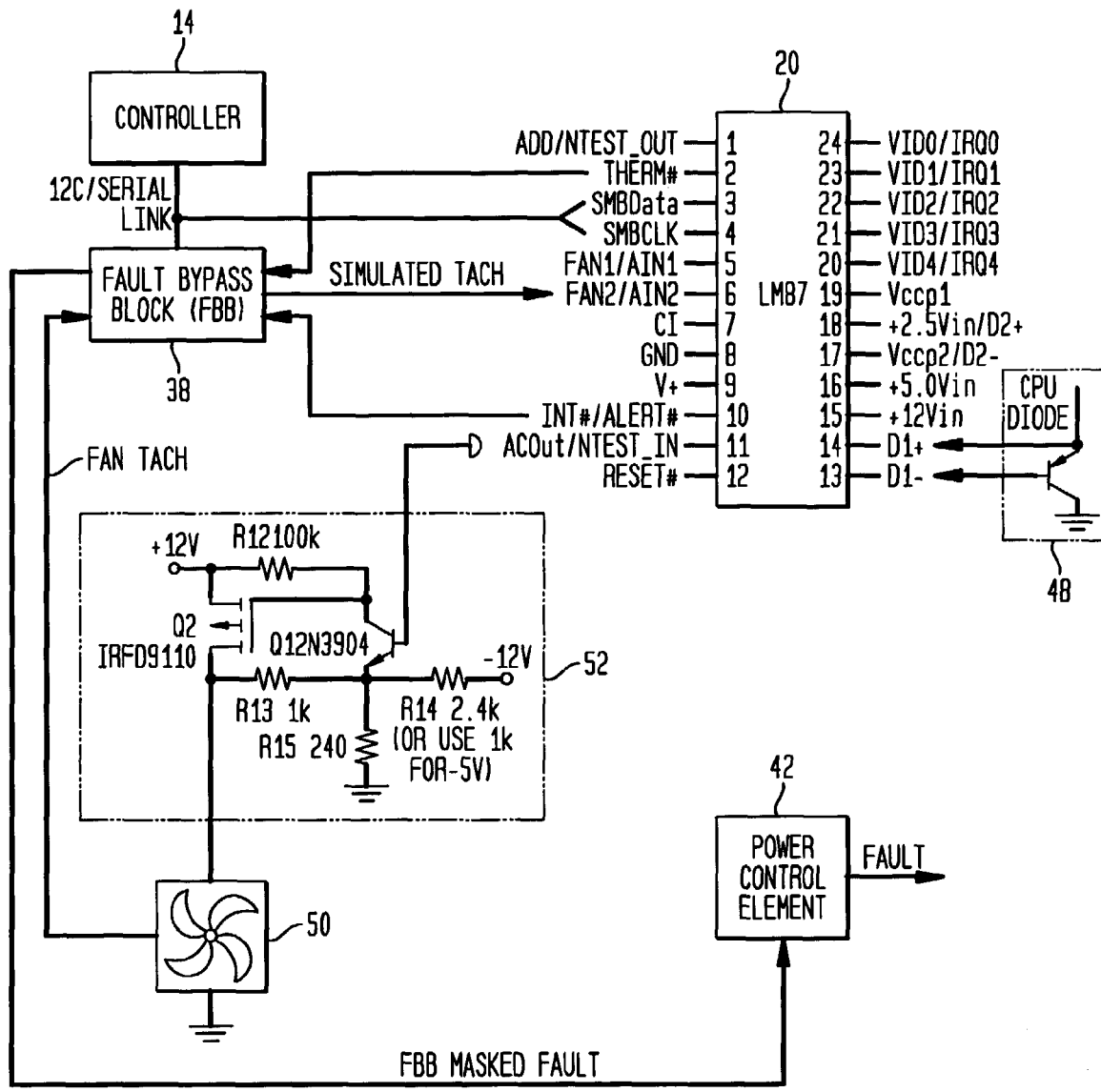

As further illustration of the implementation and the functionality of the FBB module, FIG. 4B depicts that the FBB module 38 communicates with the controller 14 and the hardware monitor 20, which in this example is selected to be an integrated circuit marketed under the trade designation LM87 by National Semiconductor company of Santa Clara, Calif., U.S.A. The LM87 chip is a data acquisition system that can be employed for hardware monitoring of various computer systems, such as servers and personal computers. For example, the LM87 can be employed to monitor power supply voltages, motherboard and processor temperatures, and fan speeds. The LM87 includes a serial bus interface that is compatible with an $I^2C$ bus, and hence can communicate with the controller 14 via an $I^2C$ bus in embodiments in which the controller 14 is a BMC, or a similar device with comparable functionality.

With continued reference to FIG. 4B, the FBB 38 can affect various functions of the LM87 hardware monitor, for example, voltage monitoring, temperature monitoring, and fan speed control. For example, in the absence of voltage margin testing, that is, during normal operation of the computer system, an output pin of the LM87 designated as INT#ALERT# can generate an interrupt signal when the voltage of a system's power rail, which is monitored by the LM87, varies by more than a selected amount, e.g., 5 percent, from its nominal value. In the absence of the FBB module 38, this interrupt signal is typically fed to the power control element 42 to cause it to take appropriate actions, e.g., power down the computer system.

However, in this example, the FBB 38 receives this interrupt signal. If no voltage margin testing of the computer system is in progress, the FBB transmits the interrupt signal to the power control element 42 so that appropriate actions can be taken in response to a voltage fault. However, during voltage margin testing of a power rail monitored by the LM87, the rail's voltage may be varied more than a threshold that would normally cause a voltage fault. For example, it is customary to vary a rail's voltage by more than 5 percent for voltage margin testing thereof. Thus, during voltage margin testing, the FBB 38 operates in margin mode, e.g., in response to a command from the controller 14, and "masks" the interrupt signal generated by the LM87 from the power control element. In other words, the FBB, rather than transmitting the interrupt signal received from the LM87, provides the power control element 42 with an appropriate signal level indicating that no faults have been detected. Such masking of the interrupt signal ensures that the power control element will not disrupt voltage margin testing while it provides response to voltage faults during normal operation of the system.

With continued reference to FIG. 4B, the FBB module 38 can also provide masking of temperature fault signals during temperature margin testing of selected components of the computer system under test. The computer system, during its normal operation, may generate and log critical system warnings, increase fan speed, or even initiate a power down of the system when one or more monitored temperatures, e.g., the CPU's temperature monitored by a diode 48, exceed selected thresholds. During temperature margin testing, such thresholds are typically exceeded. Hence, during temperature margin testing, the FBB 38 can mask temperature fault signals to ensure that margin testing will proceed without disruption. For example, the FBB can intercept a temperature interrupt signal generated at an output pin of the LM87 designated as THERM#, and can mask this signal during margin testing of the system. For example, rather than transmitting the intercepted THERM# signal to the power control element 42, the FBB can transmit another signal, or no signal in the case of an interrupt-driven scheme, to the power control element 42 indicating that no temperature fault has occurred.

With continued reference to FIG. 4B, in this exemplary illustration, the FBB 38 is also utilized to control the speed of a fan 50. In particular, the FBB receives an output signal generated by the fan, namely, the fan's "tach" output, that is indicative of the fan's speed. During normal operation of the computer system, the FBB transmits this signal to the LM87 hardware monitor. The LM87 can be programmed to increase the fan's speed when selected temperature thresholds are exceeded. For example, the LM87 can change the amplitude of a signal generated by its DACOut/NTEST_In pin that is applied as a control signal to an amplifier 52, which powers the fan, in order to increase the fan's speed. During margin testing, it may be desirable to disable control signals from the LM87 to the fan to test the computer system's reliability, for example, under failure of the fan or temperatures exceeding selected thresholds. For example, the FBB can provide the LM87 with a simulated "tach" signal, rather than the actual tach signal received from the fan, to indicate that the fan is spinning at full speed even though the actual fan speed has been reduced to lower levels for margin testing of the system.

The simulated tach signal ensures that the LM87 will not take actions, for example, by applying a corrective signal to the amplifier 52 as described above, to increase the fan's speed, thereby allowing margin testing to proceed.

Those having ordinary skill in the art will appreciate that an FBB module of the invention can also be utilized to mask faults other than those described above, if desired. For example, during frequency margin testing, the FBB can be employed to mask system detected faults that may be generated in response to a clock frequency applied to one or more marginable components crossing selected thresholds.

By way of another example, the FBB can be designed to intervene within the normal thermal response mechanisms of an Intel Xeon-class processor. The dual- and multi-class Xeon processors include thermal monitoring features, e.g., TCC (thermal control circuitry), that allow automatic and/or externally invoked modulation of core clock duty cycle in response to high temperature operating conditions, which can be similar to those encountered in a margin temperature testing environment. The FBB can be programmed to respond to such thermal-related processor signals, e.g., PROCHOT#, THERMTRIP, etc, in such a way so as to disable or to invoke duty cycle modulation -modulation that incidentally degrades performance to obtain a desired processor response behavior. This can be useful when qualifying computer-intensive systems that require full availability of processing power under all supported operating conditions. In production, the FBB can be employed to configure and dynamically respond according to thermal rules defined for a given platform, thus allowing leverage of design components and connectivity schemes on platforms specified according to different customer installation models.

Exemplary embodiments of the frequency control block and the voltage control block will be provided below. For example, the following embodiment illustrates the incorporation of a digital frequency synthesizer according to the teachings of the invention in a server computer system, which employs Intelligent Platform Management Interface (IPMI) protocol, for frequency margin testing.

Figure 5:
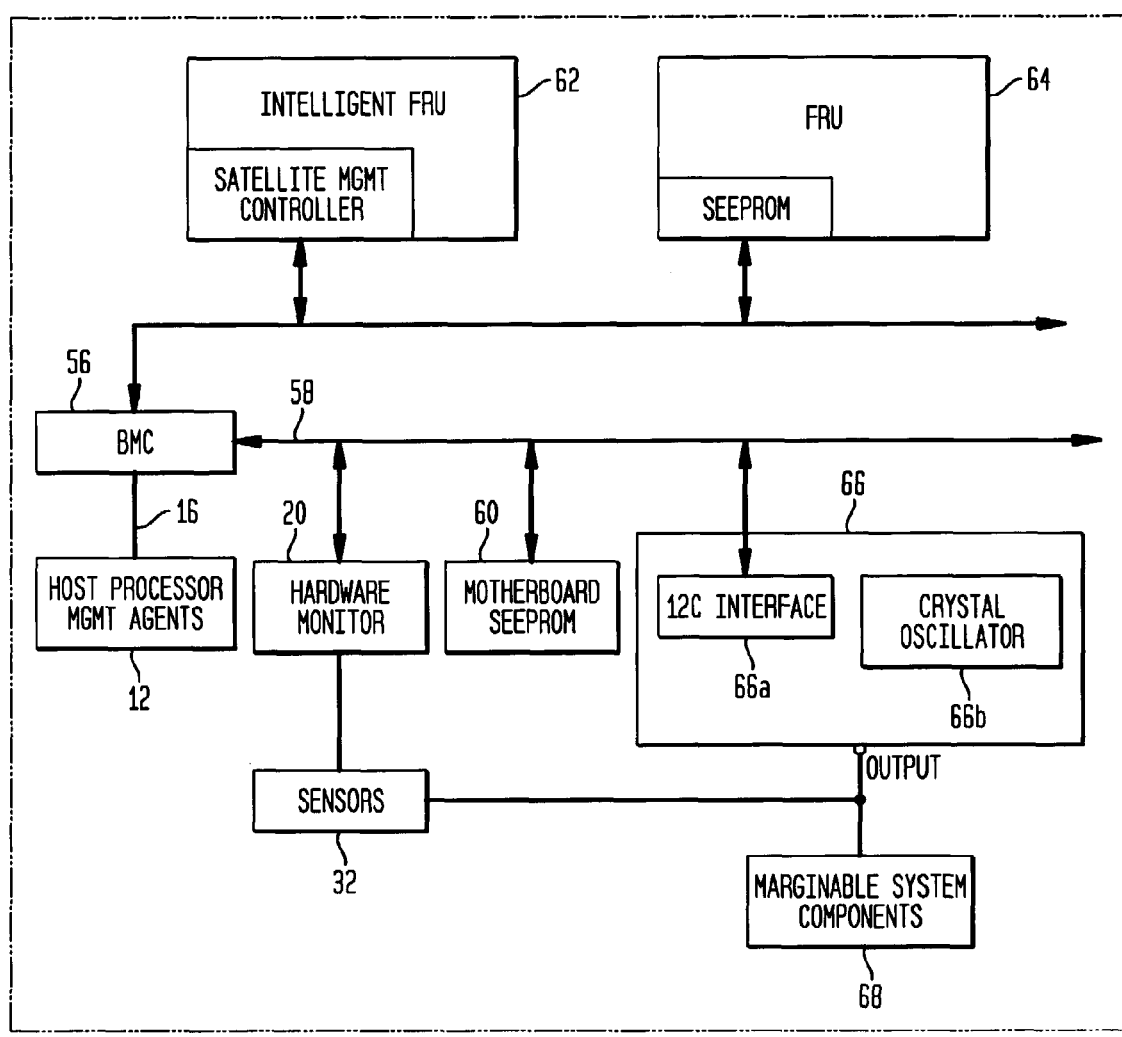

More particularly, FIG. 5 schematically illustrates a server computer system 54 that utilizes industry standard IPMI for implementing in-band and out-of-band management features. The exemplary server 54 includes a BMC controller 56 that primarily controls in-band and out-of-band hardware or software management, such as, monitoring, event logging, and error recovery. The BMC 56 communicates, via the system interface 16, with the server's operating systems, and management agent applications running on the server host processor.

The illustrated BMC controller employs a private $I^2C$ (Inter-Integrated Circuit) bus 58 for communication with selected subsystems and components of the server. For example, in this exemplary embodiment, the BMC 56 communicates, via the $I^2C$ bus 58, with the hardware monitor 20 and a serial electrically erasable programmable read-only memory (SEEPROM) 60 that contains information for the server's motherboard identification. It should be understood that the BMC 56 can also utilize the $I^2C$ bus 58 for communication with other internal server modules not shown here.

The BMC 56 further employs an $I^2C$ based Intelligent Platform Management Bus (IPMB) to communicate with and manage one or more field replaceable units (FRUs), such as illustrated FRUs 62 and 64. These FRUs can be intelligent devices, such as satellite management controllers, or passive devices, such as SEEPROMS.

With continued reference to FIG. 5, the exemplary server 54 further includes a clock generator 66, e.g., a programmable frequency synthesizer, that is incorporated in the server 54 in accordance with the teachings of the invention to communicate with the BMC 56. In particular, the exemplary clock generator 66 includes an $I^2C$ interface 66a that allows its coupling to the $I^2C$ bus to receive messages from the BMC 56. The illustrated frequency synthesizer 66 can receive a reference clock signal, for example, from an internal crystal oscillator 66b, and can generate an output clock signal as a selected multiple of the input reference signal. The output clock signal can be applied to marginable system components 68 for margin testing thereof.

More particularly, the BMC 56 can communicate with the frequency synthesizer 66 to vary its output clock frequency over a number of discrete values within a selected range. This variation of the output clock frequency can be utilized for frequency margin testing of the marginable system components 68. In other words, the BMC 56 can dynamically issue margin control commands to the clock generator to vary its output frequency.

A variety of $I^2C$ configurable integrated circuit clock generators can be employed in the practice of the invention for frequency margin testing. Such contemporary clock generators advantageously provide high accuracy and internal feedback regulation that render them particularly suitable for frequency margin testing that typically calls for low-jitter, and high-speed clock frequencies. Spread spectrum functionality is also available to help mitigate EMI (Elctro-Magnetic Interference) issues.

Figure 6A:
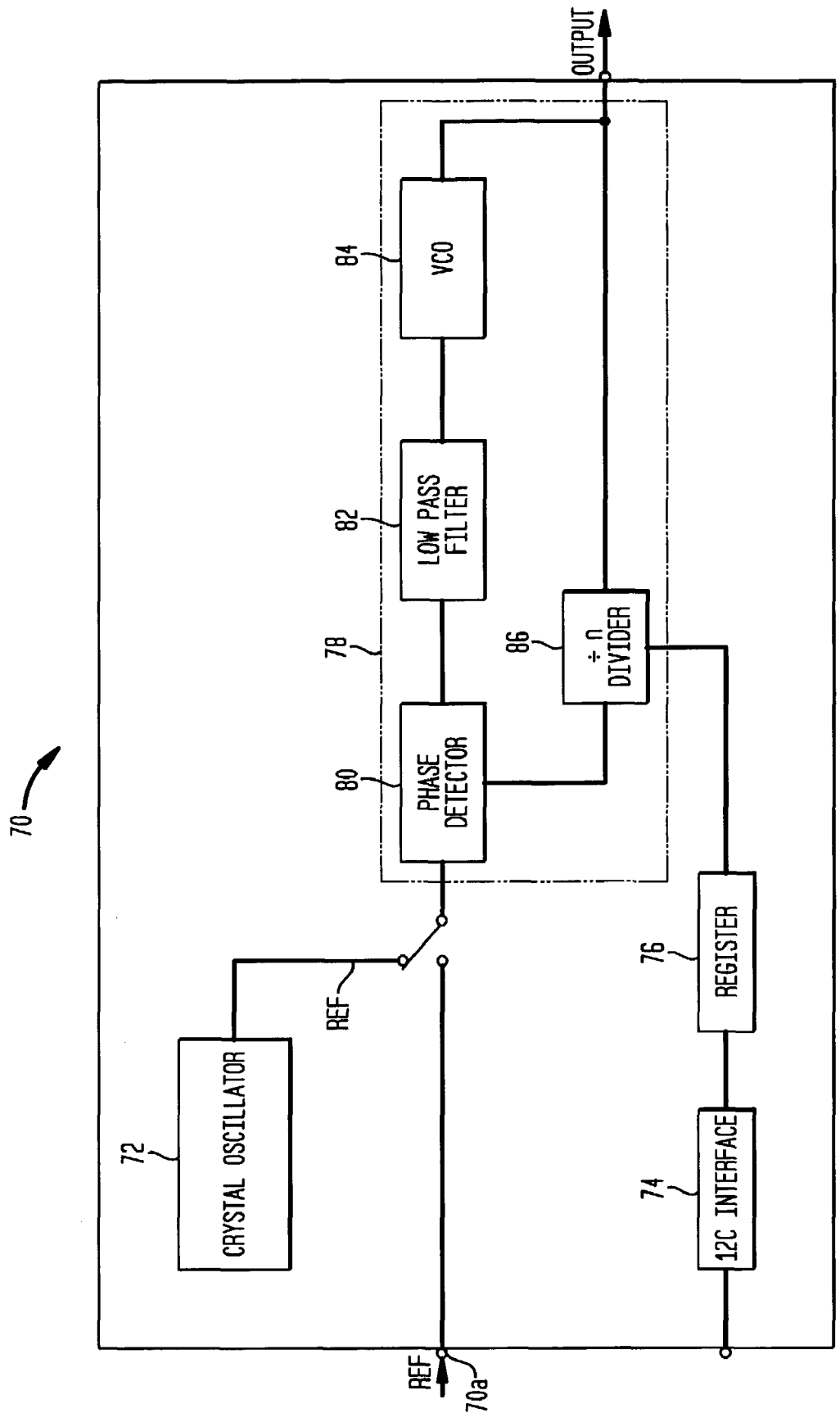
FIG. 6A is a schematic diagram of a frequency synthesizer suitable for use in the margin testing system according to the teachings of the invention.

By way of example, FIG. 6A schematically illustrates a simplified circuit diagram for a generic programmable frequency synthesizer suitable for use in the practice of the invention. The clock generator 70 can include an internal crystal oscillator 72 that can provide a stable signal at a selected frequency that can be utilized as a reference signal. Alternatively, the synthesizer 70 can employ an external reference signal coupled thereto at an input port 70a. The exemplary frequency synthesizer 70 further includes an $I^2C$ interface 74 that allows communication with an $I^2C$ bus, and a register 76 that can store instructions received, for example, from the BMC 56 (FIG. 5).

A reference signal, generated by the crystal oscillator 72 or provided by an external source, is fed into a phase locked loop circuit 78 that generates an output signal at a frequency that is a binary multiple of the reference signal based on the instructions stored in the register 76. More particularly, the exemplary phase locked loop circuit 78 includes a phase detector 80, a low pass filter 82, a voltage controlled oscillator (VCO) 84, and a modulo-n divider 86. The divider 86, which is coupled to the register 76, receives an output signal of the VCO and generates an output signal at a frequency that is a selected binary fraction of the frequency of the VCO signal. More specifically, the instruction stored in the register 76 determines the binary factor by which the frequency of the divider's output signal differs from that of its input signal, namely, the frequency of the VCO's output signal. The phase detector 78 compares the phase of the divider's output signal with that of the reference signal, and generates a correction signal based on any measured difference that is in turn applied, via a low pass filter 82, to the VCO 84 to shift the VCO's output frequency, if needed, and ultimately lock the VCO's output frequency to a desired binary multiple of the reference frequency. In this manner, the frequency synthesizer generates an output signal at a frequency determined by the instructions received, for example, from the BMC 56 (FIG. 5).

A variety of commercially available programmable frequency synthesizers can be employed in the practice of the invention. For example, a clock generator suitable for use in the practice of the invention can be selected to be a programmable phase-locked loop clock generator marketed under trade designation FS7140/FS7145 by AMI Semiconductor of Pocatello, Id., U.S.A.

Figure 6B:
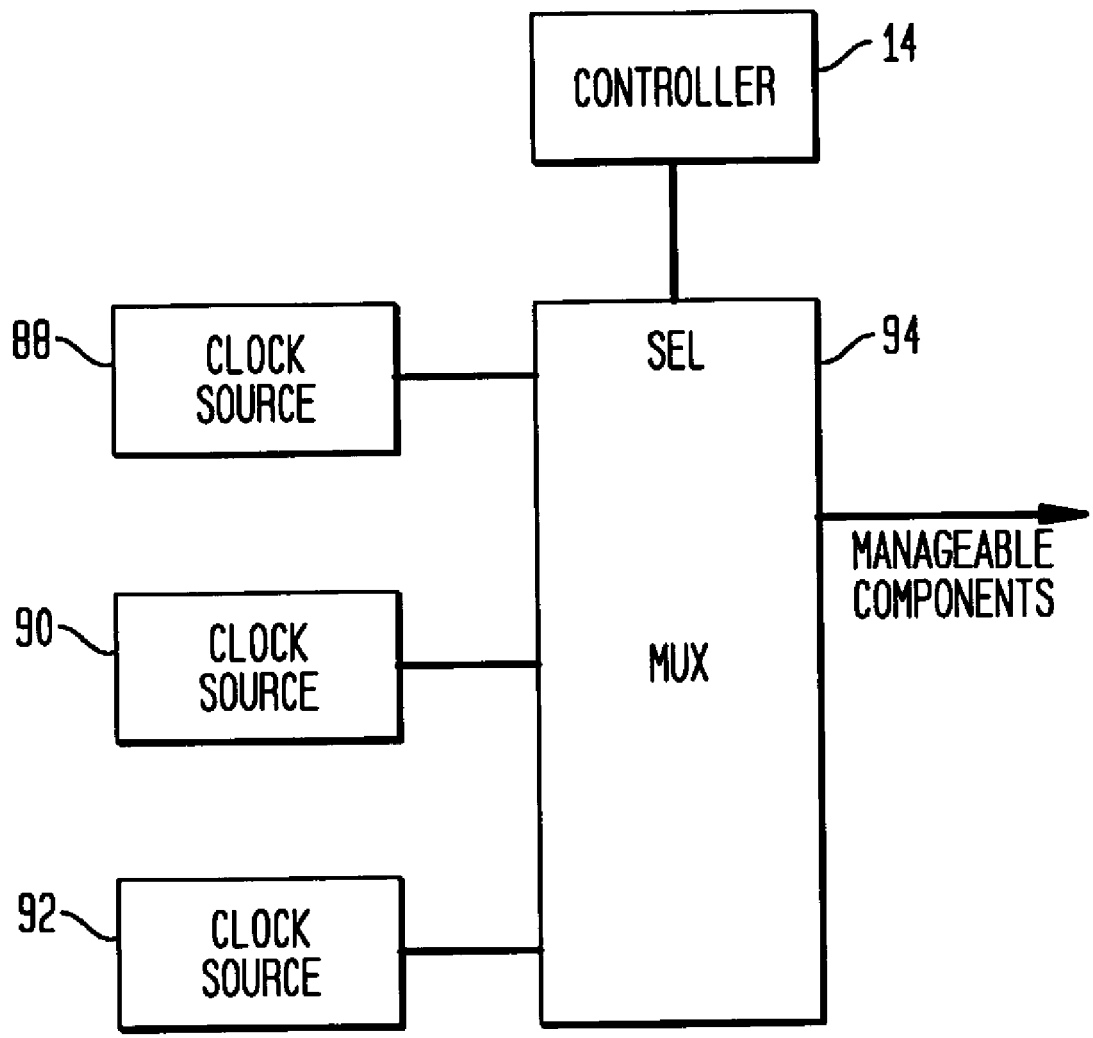
FIG. 6B is a schematic diagram of an exemplary implementation of a frequency margin testing system according to one embodiment of the invention, FIG. 7 schematically depicts the use of a frequency synthesizer whose output frequency can be adjusted by an input bit pattern in a margin testing system of the invention, FIG. 8 schematically depicts a margin testing system according to one embodiment of the invention in which an I²C-based I/O expander is incorporated, FIG. 9A schematically illustrates an embodiment of a margin testing system of the invention that utilizes an I²C-based I/O expander and multiplexers to ensure that default frequencies are applied to selected components in the absence of instructions from a BMC controller or in the event of circuit error(s)

With reference to FIGS. 2 and 6B, in another embodiment, the FCB module 36 can be implemented by utilizing a plurality of clock sources, such as clock sources 88, 90, and 92, each of which generates a clock signal at a selected frequency. By way of example, the clock source 88 can generate a signal at a frequency of 95 MHz while the clock sources 90 and 92 can generate signals at 100 MHz and 105 MHz, respectively. In response to commands from the controller 14, a multiplexer 94, which receives the output of each clock source as an input signal, can select and route one of these clock signals to its output as a test frequency for application to marginable components of the computer system. Although only three clock sources are illustrated in this example, those having ordinary skill in the art will appreciate that any number of clock sources can be employed for generating a plurality of different test frequencies.

Figure 7:
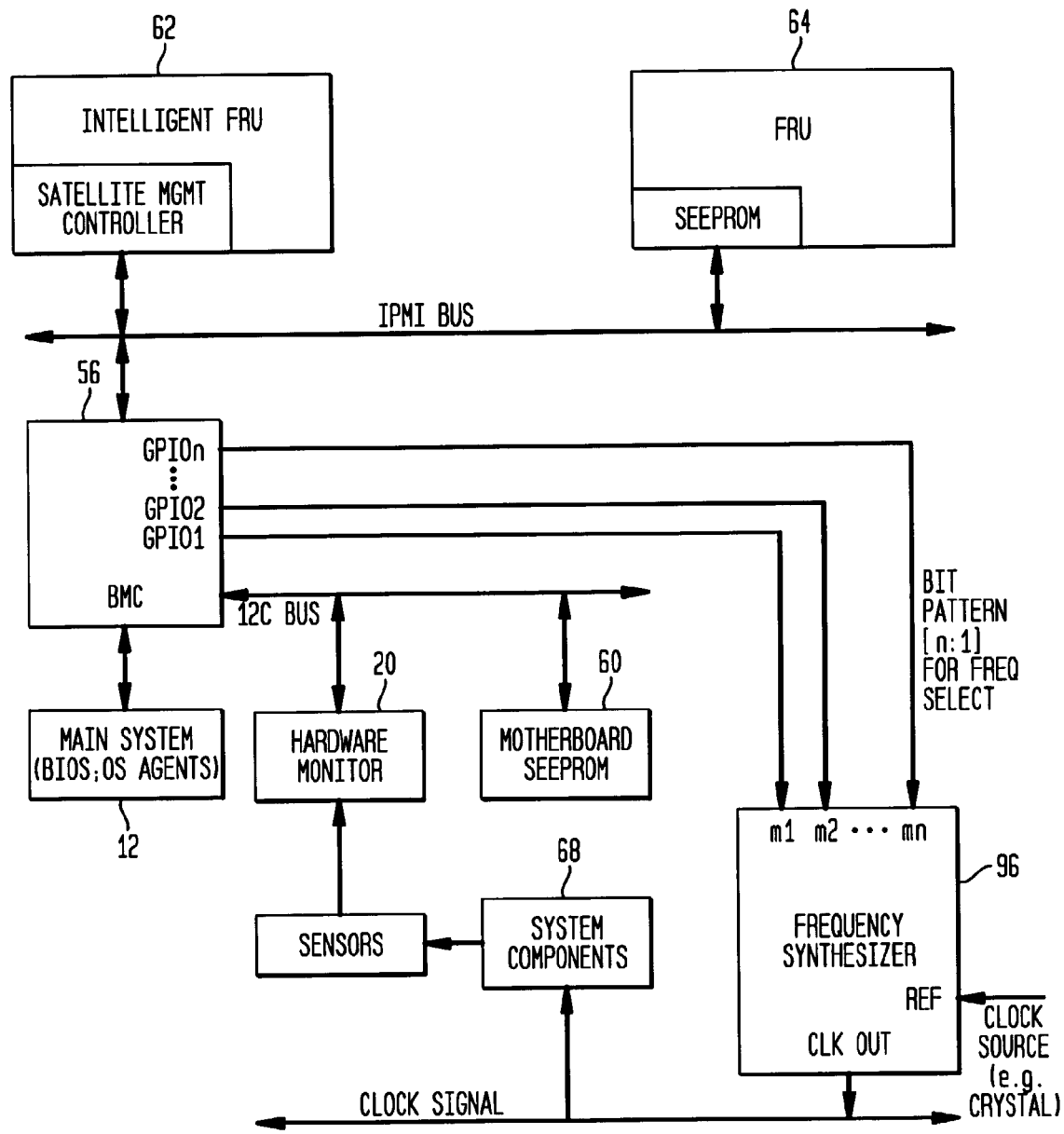

With reference to FIG. 7, some embodiments of the invention provide frequency margin testing by utilizing a frequency synthesizer that can generate a discrete number of clock frequencies, each of which can be selected in response to an input bit pattern received from the controller, e.g., BMC. For example, the BMC 56 can supply a 16-bit input to a synthesizer 96 in order to select one of the $2^{16}$ frequencies that can be generated by the synthesizer as its output clock frequency. For frequency margin testing, the BMC 56 can apply a sequence of bit patterns to the frequency synthesizer, where each bit pattern instructs the synthesizer to generate one of its discrete output frequencies. For each output frequency, the response of the system can then be monitored in a manner described in more detail below.

Figure 8:
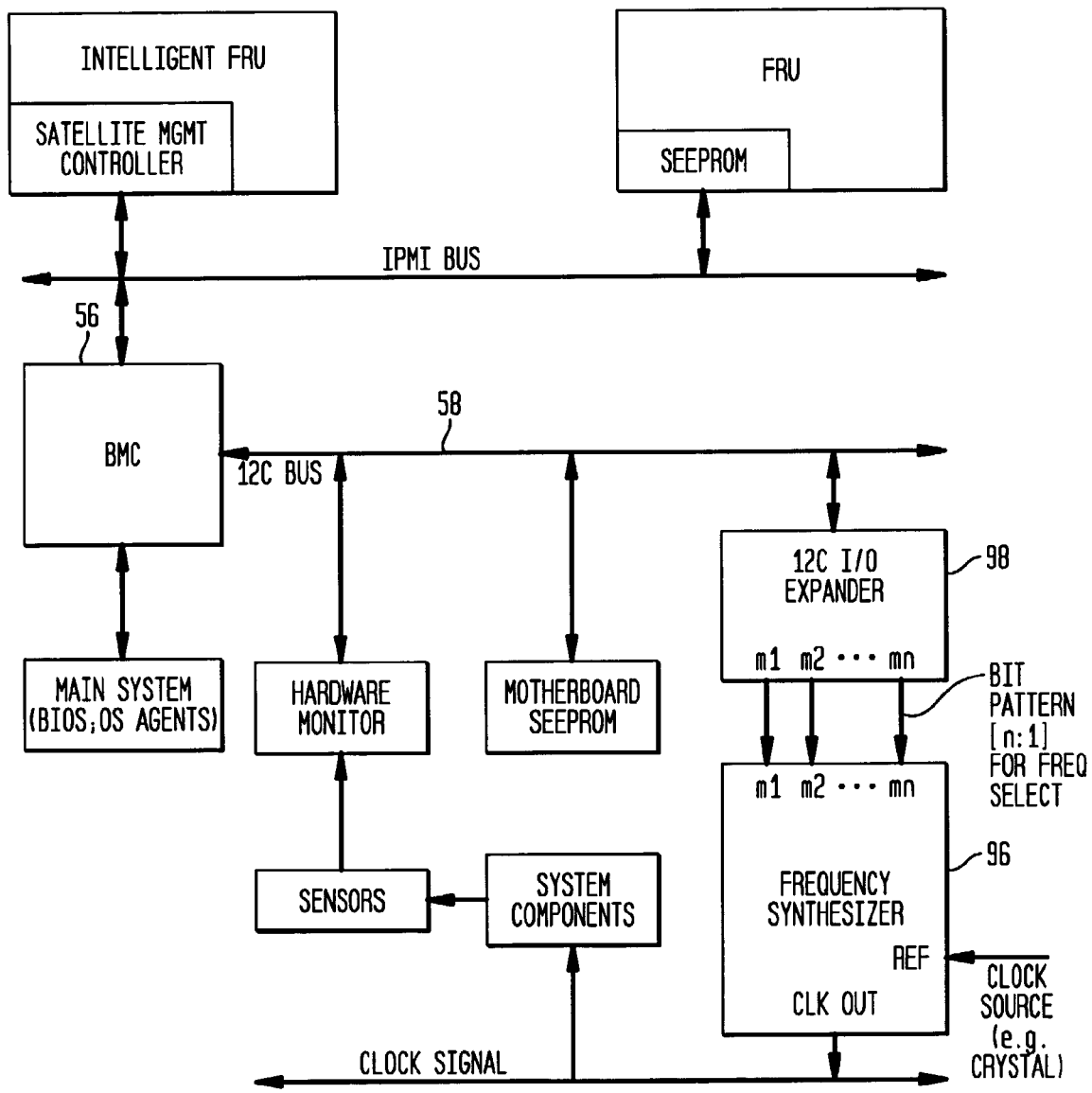

In another embodiment schematically depicted in FIG. 8, an I²C I/O expander 98 is employed for supplying a bit pattern of input signals to the synthesizer 96 in order to set the synthesizer's output clock frequency to a desired value. More particularly, the BMC 56 can communicate with the I²C I/O expander, via the I²C bus 58, to set values of selected output pins of the expander 98 to a desired bit pattern required to choose a synthesizer's output frequency of interest. A number of commercially available I²C I/O expanders can be employed in the practice of the invention. For example, an I²C expander chip manufactured by Phillips Semiconductors of Eindhoven, The Netherlands, under the trade designation PCF8575C can be utilized.

Figure 9A:
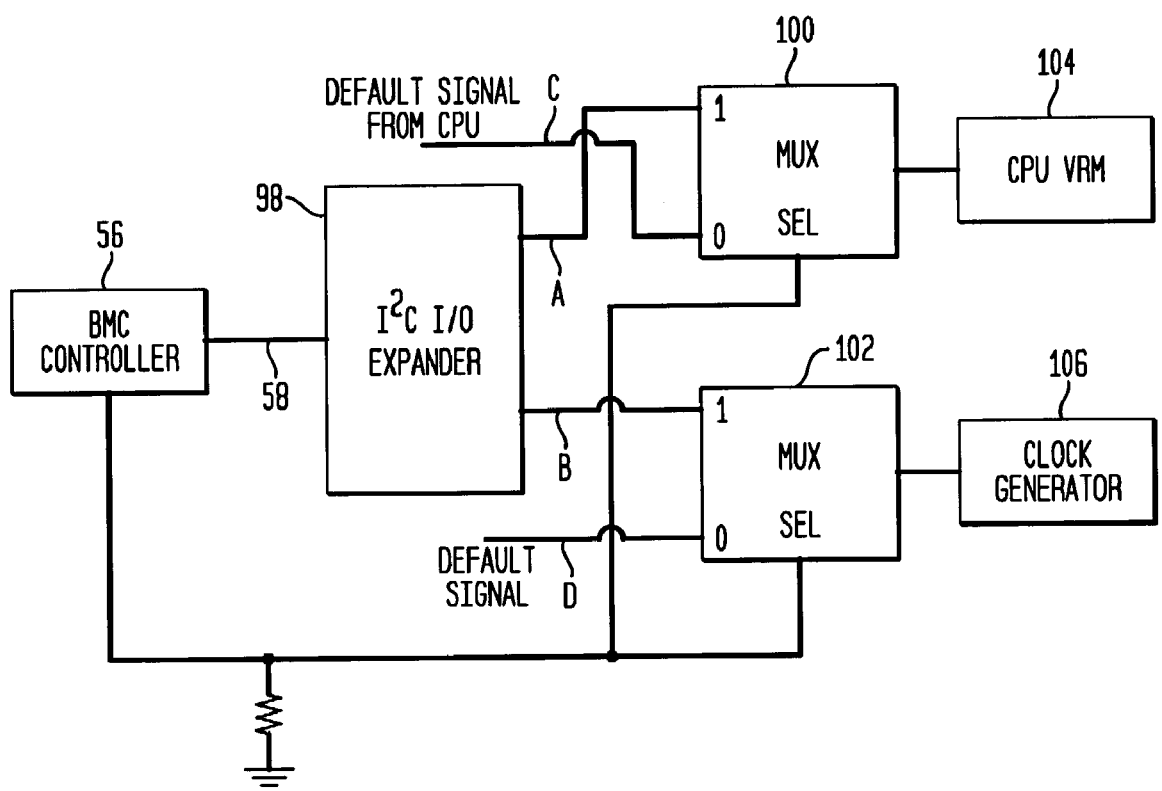
FIG. 9B is a flow chart depicting various steps in one embodiment of a method of the invention for frequency margin testing of a computer server.
FIG. 9C is a flow chart depicting various steps in another embodiment of a method of the invention for frequency margin testing of a computer server, FIG. 10 schematically depicts a margin testing system of according to one aspect of the invention for voltage margin testing of a computer system.

A frequency margin testing system or a voltage margin testing system according to the teachings of the invention is preferably implemented such that clock frequencies or power rail voltages applied to marginable system components default to nominal values until instructed to do otherwise, for example, in response to commands from the controller. By way of example, with reference to FIG. 9A, in one exemplary implementation, the BMC 56 communicates, via the I²C bus 58, with the I²C I/O expander 98 whose output is in turn coupled to two multiplexers 100 and 102. More particularly, one set of output pins of the I²C I/O expander 98, herein schematically depicted as signal A, provide one set of input values for the multiplexer 100 and another set of output pins of the I²C-based I/O expander 98, herein schematically depicted as signal B, provide a set of input values for the other multiplexer 102. In addition, the multiplexer 100 receives default input signals C from the CPU that provide default voltage select signals for VRM type voltage regulators 104, and the multiplexer 102 receives default input signals D that provide default clock frequency for the clock distribution chip 106 whose output frequency can be adjusted by a bit pattern of input signals applied thereto.

In the absence of a signal applied to the SEL input of each MUX by BMC 56, the output of each multiplexer, and hence the frequencies applied to the clock distribution chip or voltage select signals applied to the VRM type regulators, are determined by the default input signals, namely signals C and D. For frequency margin testing, the controller can transmit one or more commands to the I²C I/O expander to set the values of its output pins corresponding to signals A and/or B, which provide input signals for multiplexer 100 and 102, respectively. In addition, the controller applies a signal to the SEL pin of either, or both, multiplexers to cause the multiplexer to route the signals received from the I²C I/O expander to its output pins. Thus, the output signal of one or both multiplexers changes from default values to values dictated by the controller, which in turn causes adjustment of the frequency generated by the clock distribution chip 100 and/or voltage select signals applied to the VRM-type regulators. In this manner, default clock frequencies and default VRM voltages are employed in the absence of contrary instructions from the controller, and margin frequency or margin voltage tests are readily accomplished in response to commands from the controller.

Typically, the level of granularity required for frequency margin testing is not as fine as that needed for voltage margin testing. However, programmable clock generation devices that provide fine frequency resolution are available if the ability to perform precise and granular frequency variation is imperative to the completion of a margin test plan.

A testing system of the invention, such as the above exemplary system, can be employed to perform frequency margin testing of various components of a computer system. By way of example, a frequency margin testing system according to the invention can be incorporated into an Itanium Processor Family (IPF) based computer server to provide frequency margin testing of the server's front-side bus (FSB) clock frequency. Such a frequency margin testing of the FSB may be desired, for example, when the server's CPUs are replaced with CPUs of a new generation.

Figure 9B:
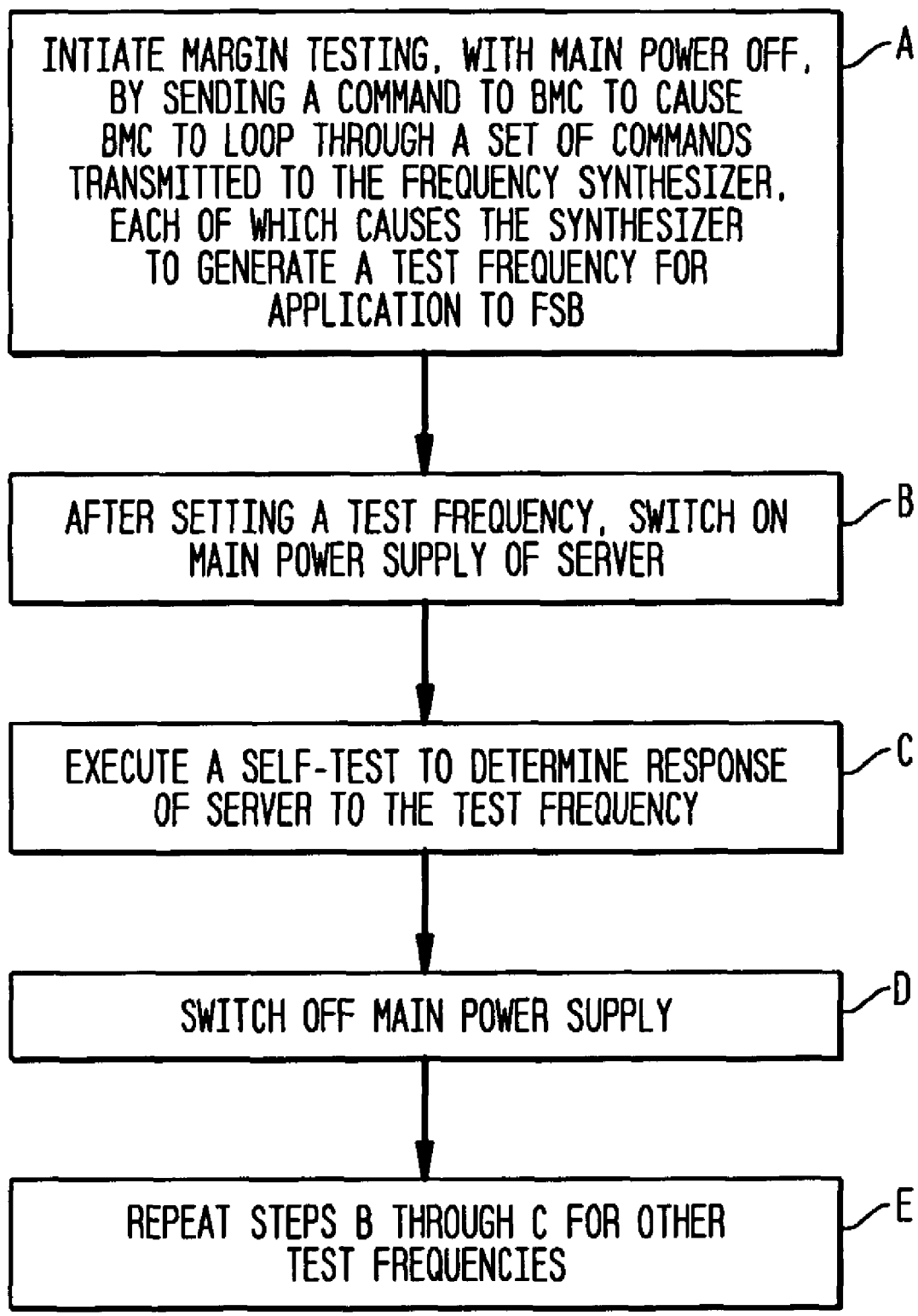

With reference to the flow chart of FIG. 9B, in one embodiment, to perform the frequency margin testing of the FSB, in step A, the BMC can be caused to initiate automated frequency margin testing of the FSB, e.g., a field engineer can issue a command to the BMC via a console to cause the BMC to initiate margin testing. Upon initiation of margin testing, the BMC can cause a frequency synthesizer to apply different frequencies to the FSB over a frequency range centered about a nominal FSB clock frequency. For example, the BMC's firmware can be pre-programmed to loop through a number of commands transmitted to a frequency synthesizer, each of which sets the synthesizer's output frequency to one of a plurality test values. For example, with the main system power off, the BMC, which can be powered by a stand-by supply, can transmit a message, via the I²C bus, to the digital frequency synthesizer to instruct the synthesizer to apply a selected frequency, e.g., a frequency of 180 MHz, to the FSB, which runs nominally at a frequency of 200 MHz. Subsequently, in step B, the BMC will switch on the main power to the server, which causes the system to execute its built-in self test (BIST) as part of the early boot-up process (step C)

The BMC monitors the self test. If the test fails, the BMC stores the test results and information regarding the test point, e.g., test frequency, on non-volatile memory. The BMC then switches off the main system power supply (step D), and sends another command to the frequency synthesizer to instruct the synthesizer to apply another test frequency, e.g., a frequency of 190 MHz, to the FSB (step E). If the self-test is successful, the BMC allows the boot process to proceed to the stage of loading the operating system, logs the test result, switches the main power off, and instructs the synthesizer to apply another test frequency to the FSB. In this manner, the frequency synthesizer applies a number of different test frequencies within a selected range to the FSB, and the BMC stores the test results.

Upon completion of the test under BMC control, test results can be examined to identify failure points, if any, and to provide any necessary trouble-shooting to ensure that the upgraded server will function reliably. Further, the margin test results can be uploaded onto a database for reliability/quality analysis.

Figure 9C:
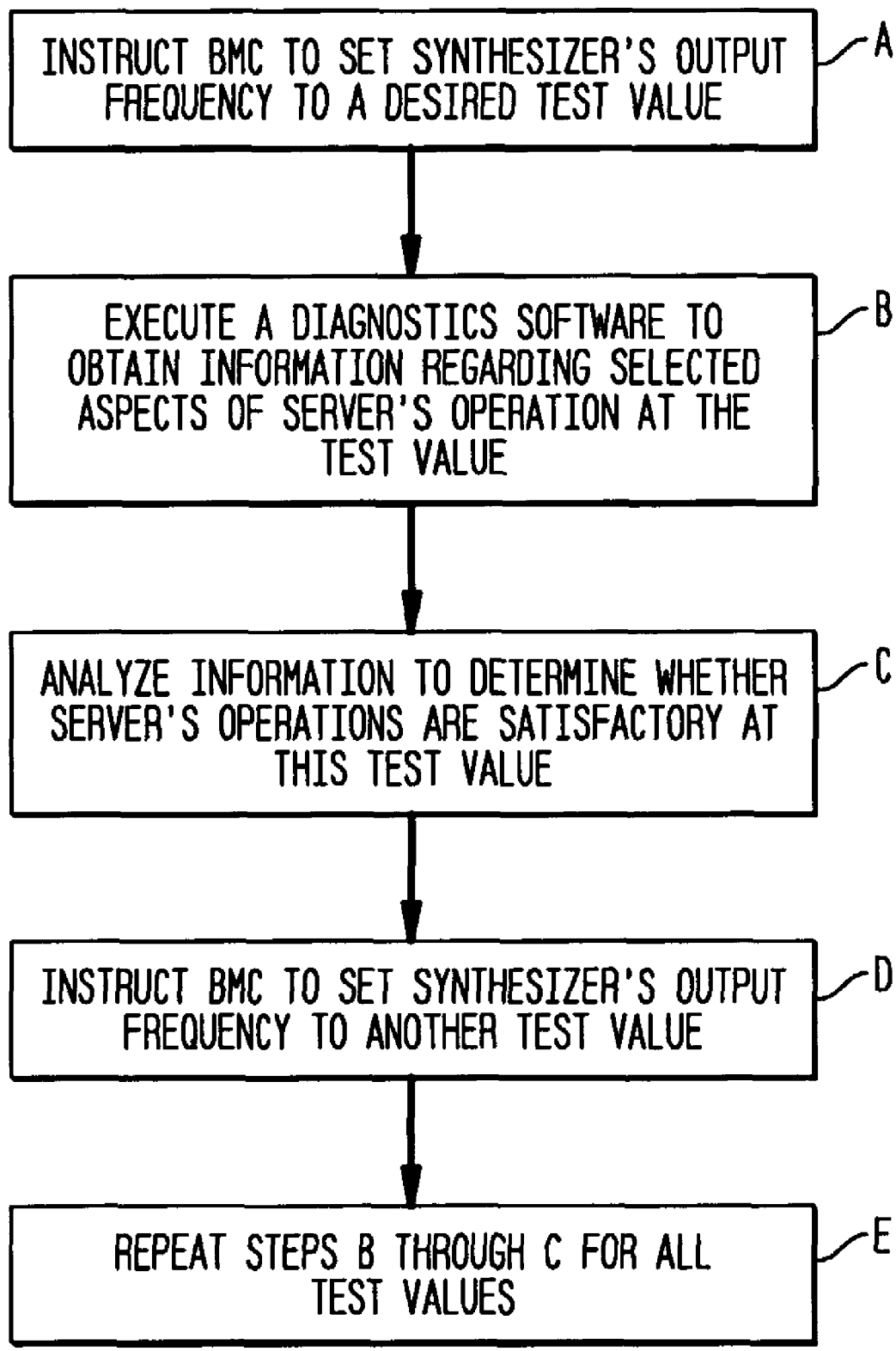

Alternatively, with reference to the flow chart of FIG. 9C, the frequency margin testing can be performed in the following manner. In step A, the BMC can be instructed to set the synthesizer's output frequency to a desired test value. This can be done, for example, by an external scripting entity that issues a command to the BMC. A diagnostics software can then be executed, in step B, on the server to obtain information regarding selected aspects of the server's operation at this test point. Those having ordinary skill in the art will appreciate that such software is commercially available. This information can be analyzed to determine whether the server's operations are satisfactory at this test point. The information can also be recorded, if desired. Subsequently, the BMC can be instructed to adjust the synthesizer's output frequency to the next test value (step D), and the above process can be iterated until information at all test points are collected and analyzed.

In some embodiments of the invention, a descriptor file can be provided that includes a policy for BMC to follow in performing margin testing of the system under test. For example, such a descriptor file can include parameters associated with a margin test, e.g., voltage values for different test points, instructions regarding the steps to be taken in case of failure at a test point, etc. The BMC can gather information regarding the results of a margin test, e.g., failure or success of the test, at a particular test point by, for example, reading ("snooping") data regarding the test results transmitted on a bus, e.g., an RS232 bus, to an external terminal, or by communicating with IPMI daemons running on the system's OS. Based on the obtained test results and the policy defined in the descriptor file, the BMC can take a subsequent action. For example, the test results data may indicate the failure of the test at a particular test point, and the descriptor file may indicate that in case of a first failure at a test point, the test should be re-run. In such a case, the BMC will reset the test value for another execution of the test at the previously failed test point. Those having ordinary skill in the art will appreciate that a descriptor file can include instructions other than those provided above.

Figure 10:
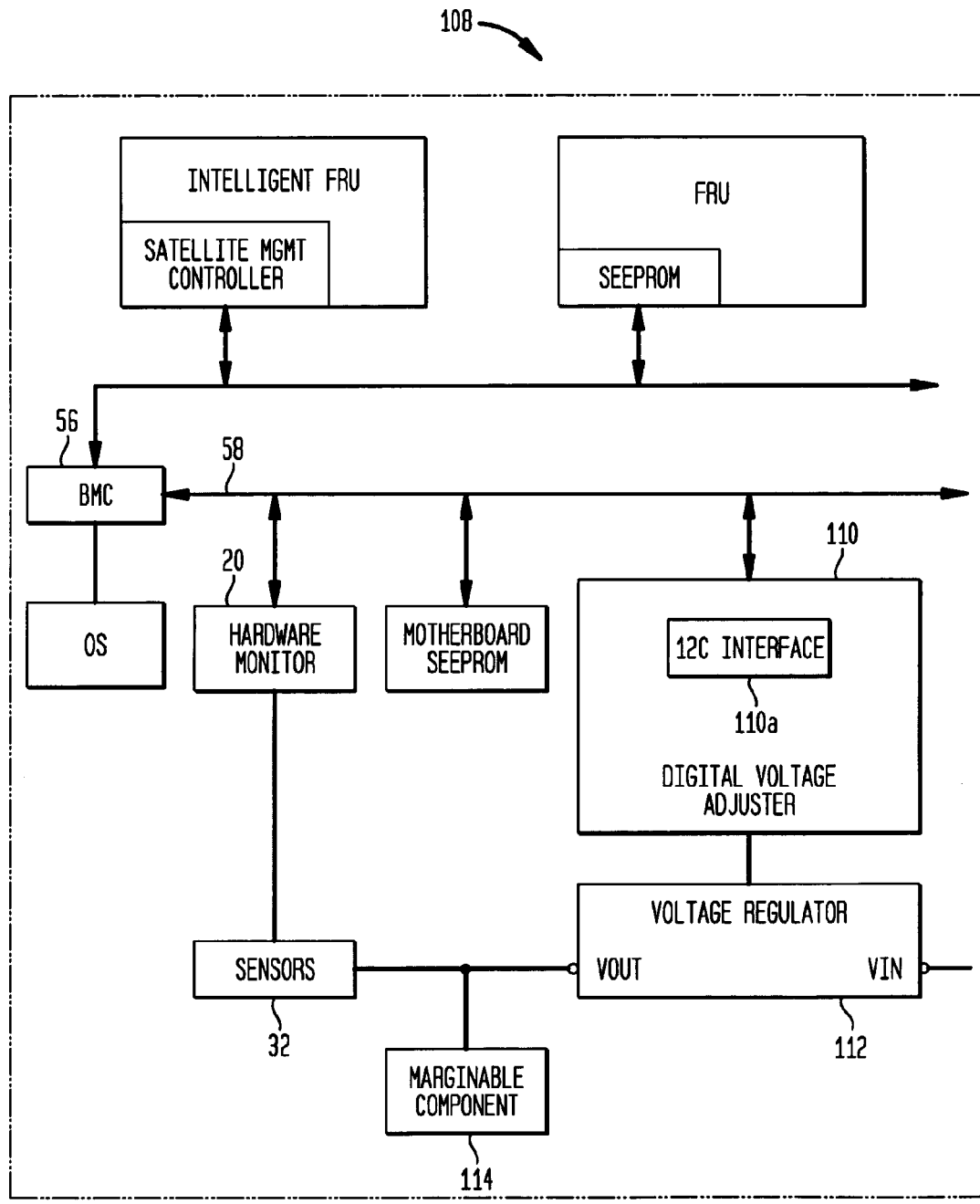

Another operating parameter for which margin testing is typically needed relates to voltage applied to various components of a system under test. FIG. 10 schematically illustrates incorporation of a voltage margin testing system according to the teachings of the invention in a computer server that employs the IPMI protocol. The exemplary server 108 includes a BMC controller 56 that provides in-band and out-of-band hardware and software management, as described above. As in the above embodiments, in this exemplary embodiment, the BMC 56 employs a private I²C bus 58 for communication with selected subsystems and components of the server.

A digital voltage adjuster 110, having an I²C communications interface 110a for coupling to the I²C bus, is incorporated in the server, in a manner described in detail below, to allow voltage margin testing of marginable components of the server. The digital voltage adjuster can be implemented as a single integrated circuit, or alternatively, it can be implemented as a plurality of integrated circuits.

The digital voltage adjuster 110 is coupled to a voltage regulator 112, which receives an input voltage and generates a regulated output voltage that can be utilized as a rail voltage for application to various components of the server, such as marginable components 114. In other words, the voltage regulator 112, which can be a linear or a switching regulator, can provide a regulated voltage rail for supplying power to various components and modules of the server.

The voltage adjuster 110, in response to command signals received from the BMC controller, can affect variation of the regulator's output voltage over a selected range for margin testing of one or more components to which such voltage variation is applied. For example, the BMC can instruct the digital voltage adjuster 110, via commands transmitted on the I²C bus 58, to cause variation of the regulator's output voltage, and hence variation of the voltage applied to the components 114. For example, the voltage applied to the components 114 can be stepped through a plurality of values within a selected range for performing voltage margin testing.

In one preferred embodiment, the digital voltage adjuster is selected to be a digital potentiometer that can function as a digitally controlled variable resistor in a feedback resistance network of the voltage regulator 112 to adjust the regulator's output voltage. For example, with reference to FIG. 11, a digital potentiometer 116 can be incorporated in a feedback resistance network of a linear regulator 118 to function as an adjustable resistor connected in series with another feedback resistor 120 in the regulator's feedback resistance network. The digital potentiometer can vary the resistance of the regulator's feedback circuit, thereby adjusting the regulator's output voltage.

Figure 11:
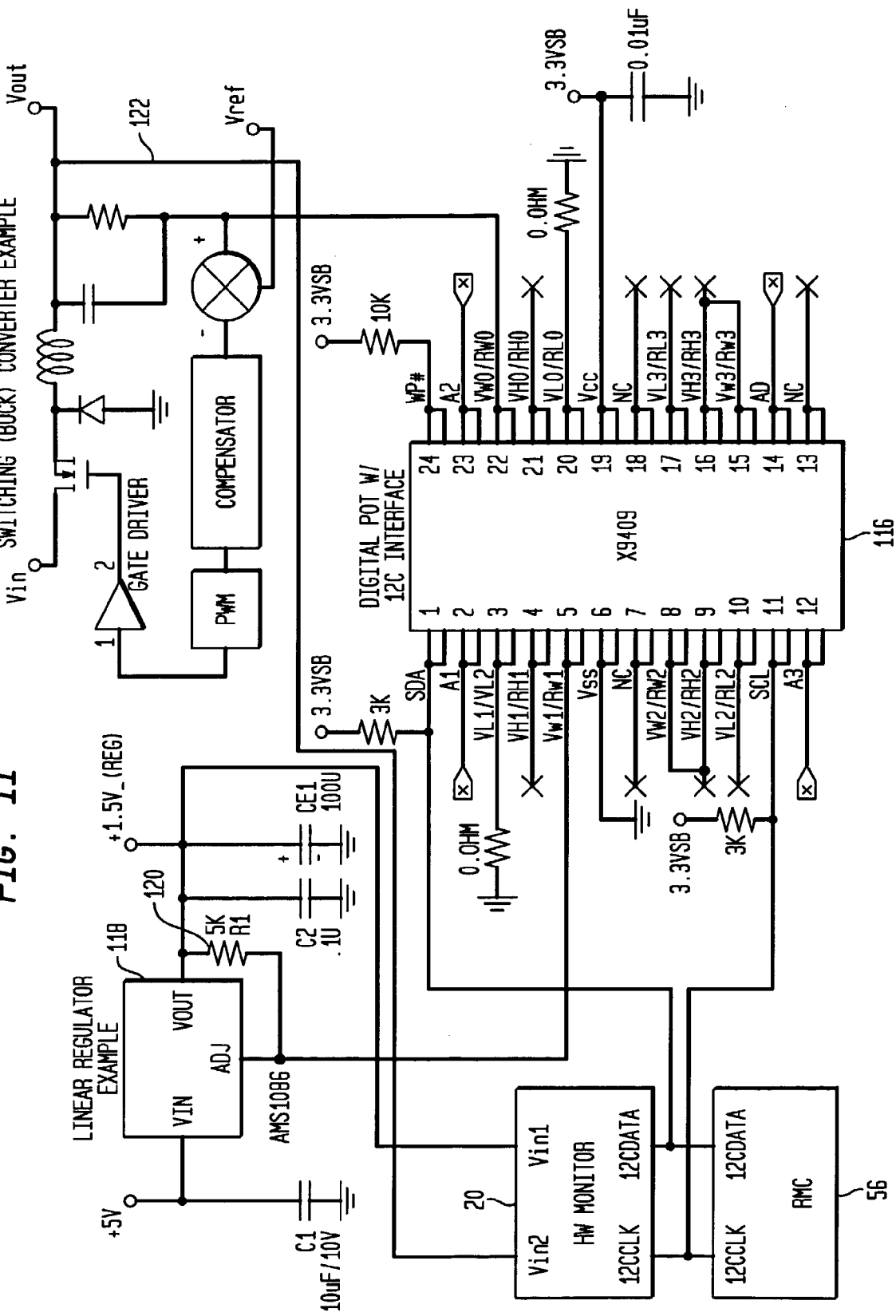
FIG. 11 is a diagram illustrating the incorporation of a digital potentiometer in a resistive feedback circuit of two regulators in a voltage margin testing system according to one embodiment of the invention for adjusting the regulators' output voltages, and FIG. 12 schematically illustrates another implementation of a voltage margin testing of the invention that employs a digital-to-analog converter for setting test voltages.

More particularly, with reference to both FIG. 10 and FIG. 11, the digital potentiometer can adjust the resistance in the feedback resistance circuit of the regulator 118 in response to commands received from the BMC 56, and thus vary the regulator's output voltage. This variation of the regulator output voltage can in turn cause variation in the voltage of one or more components to which the regulator's output voltage is applied. Further, as shown in FIG. 11, the digital potentiometer 116 can also be utilized to adjust the output voltage of a switching regulator 122.

With continued reference to FIGS. 2, 10 and 11, by way of example, before the server's primary power source (not shown) is switched on, the external system 24 can transmit a command, for example, in the form of Set_Voltage(Rail, Value), to the controller 56 to instruct the controller to set the voltage at a selected rail to a specified value for performing margin testing. It is the responsibility of the controller 56 to interpret this command into requisite I²C messages, and issue the messages accordingly, in order to service the command. As such, in response to this command, the controller 56 transmits a command to the digital potentiometer 116 to adjust its resistance such that the regulator's output voltage would be set at an initial value that is slightly below the voltage value specified by the external system. For example, the initial value can be less than the specified value by a few percents.

In general, the degree of deviation of the initial voltage value from the specified value depends, among other factors, on the tolerance of the digital potentiometer. For example, if the full range of the digital potentiometer's resistance tolerance is 5 percent, the initial voltage value can be set about 5 percent below the specified value to ensure that the margin voltage will not exceed a threshold that would damage the system components.

Subsequently, the BMC 56 transmits a command to the power control module 42 to switch on the system's primary power source. Various implementation of the power control module 42, and its communication with the BMC 56, are known to those having ordinary skill in the art. The hardware monitor 20 records the regulator's output voltage, and communicates the recorded voltage to the BMC. Typically, the voltage read by the hardware monitor will be below a tolerable range of the specified value. In such a case, the controller 56 will re-issue another command to instruct the digital potentiometer to correct the regulator's output voltage in the direction of the specified value. Based on a particular implementation of the controller's firmware, this voltage calibration cycle may be performed once, or it may be iterated several times before a sufficiently accurate voltage is read back from the hardware monitor.

Upon setting the regulator's output voltage to the desired test value, the controller 56 can instruct the power control module 42 to switch on the computer system's main power source. The system can then execute, for example, its built-in self-test, which can be monitored by the controller. This process can be repeated at subsequent test voltages to obtain data regarding the system's response to a plurality of discrete test voltages.

Although one digital voltage adjuster is shown in the above exemplary embodiments, those having ordinary skill in the art will appreciate that two or more digital voltage adjusters, e.g., digital potentiometers, can be utilized in a server, or any other suitable computer system, in accordance with the teachings of the invention to adjust voltage variation of different voltage rails within the server. Thus, the process of setting rail voltages to test values can be performed across multiple component modules to accomplish testing of the computer system in an aggregate margin state. Similarly, in the above frequency margin testing embodiments, more than one clock frequency can be set at a time for performing aggregate margin frequency testing.

A variety of digital potentiometers can be employed in the practice of the present invention. For example, a quad digitally controlled potentiometer having an $I^2C$ interface and marketed by Xicor, Inc. of Milpitas, Calif. under the trade designation X9409 can be utilized as a digital voltage adjuster in a voltage margin testing system of the invention.

Some embodiments of the invention, a feedback signal, for example, from the BMC controller, is periodically fed into a digital voltage adjuster, e.g., a digital potentiometer, that forms a portion of a resistive feedback circuit of a voltage regulator, as described above, to adjust the resistance of the voltage adjuster so as to set the regulator's voltage with a desired accuracy to a selected value. For example, FIG. 11 schematically illustrates an exemplary implementation of such a feedback mechanism in which the hardware monitor 20 receives the output voltage of the regulator 118 as an input voltage in order to monitor the regulator's output voltage. The BMC 56 (FIG. 10) periodically, for example, once every few milliseconds, queries the hardware monitor 20 to obtain the value of the regulator's output voltage. If the BMC determines that the regulator's output voltage deviates from a desired value by more than a selected threshold, it transmits a command to the digital potentiometer 116 to adjust the potentiometer's resistance, in a manner described above, so as to cause the regulator's output voltage to be at the desired value. This feedback mechanism is useful in accurately setting the regulator's output voltage. For example, in some cases, the actual resistance of a digital potentiometer can deviate from its nominal resistance by a few percent, thereby causing an inaccuracy of a few percent in the regulator's output voltage. The above feedback mechanism can be employed to correct such discrepancies between the actual and the nominal values of the potentiometer's resistance, and hence improve the accuracy of the values of test voltages.

A voltage margin system according to the invention, such as those described above, that incorporates a digital voltage adjuster in a computer system, such as a server, that operates under control of a controller internal to the computer system for voltage testing of selected components of the computer system provides a number of advantages. For example, such a voltage margin testing system is non-invasive in that it does not require utilizing jumpers or switches for modifying resistive values of feedback circuitry of voltage regulators for adjusting the regulators' output voltages, which can be time-consuming and can adversely affect the testing accuracy. Further, a voltage margin testing system of the invention obviates the need for external test equipment, and allows performing voltage testing automatically by software control. Moreover, a voltage testing system of the invention renders voltage testing during development, manufacturing, or in the field, practical, thus enhancing product reliability.

Another advantage of a voltage margin testing of the invention is that it facilitates root-cause analysis of system failures. For example, in some cases, intermittent failures can be made repeatable, and hence more readily diagnosed and corrected, by varying power rails voltages. Other advantages of a voltage margin testing of the invention are readily recognizable by those having ordinary skill in the art.

By way of example, a voltage margin testing of the invention can be utilized to test a 2.5 volt power rail that supplies power to DDR SDRAM DIMMs in a server. Such a test may be required, for example, during manufacturing to qualify DIMMs obtained from a new DRAM vendor. Such a voltage margin test can be conducted, for example, as follows. Initially, the BMC controller can be placed in a special mode, for example, by gaining console access to the BMC and issuing a mode-change command. In this mode, the BMC will unlock a command that performs automated voltage margin testing of the DIMM rail. More particularly, the BMC can vary the voltage of the DIMM rail over a number of values (e.g., centered about the nominal voltage value of 2.5 V), each of which corresponds to a test point, by issuing commands to the digital potentiometer, as described above.

The test of the system at one such exemplary test point can be accomplished as follows. With the server's main power source off, the BMC, which can be powered by a standby power source, transmits an $I^2C$ message to the digital potentiometer to cause it to adjust its resistance so that the power rail's voltage is at 2.25 V (10% less than the nominal voltage). Subsequently, the BMC switches on the server's main power source. The system executes its built-in self-test (BIST), which is monitored by the BMC, as part of the early boot process. If the BIST fails, the BMC logs the result and information regarding the test point, e.g., test voltage, to non-volatile memory, turns off the server's main power source, and instructs the digital potentiometer to set the next test voltage, e.g., 2.375 volts. If the BIST is successful, the BMC allows the boot process to proceed to the operating system (OS) load stage, logs the success of the test, followed by turning off the main power source, and instructing the digital potentiometer to set the next test point. After the OS load stage, various system-level subsystem stress diagnostics can be executed, either automatically through scripted batch calls, or via BMC command messages to the OS agents. Run logs can be stored off-system or on local hard disks for later analysis.

Once all test points are executed, results data can be collected and examined. If there are failures at one or more of the test points, the test executor can conduct root-cause analysis of the failures. Further, the margin test information can be uploaded into a database for reliability/quality analysis.

In a similar fashion, the above exemplary voltage margin testing can be performed by instructing the BMC to set the test voltage to an initial value. A diagnostics software can then be executed on the server to collect information regarding selected operations of the server at this test voltage. The information can be analyzed and recorded, or be recorded for future analysis. Subsequently, the BMC can be instructed to set a new test voltage, and the above process can be iterated to obtain data at all desired test voltages.

Figure 12:
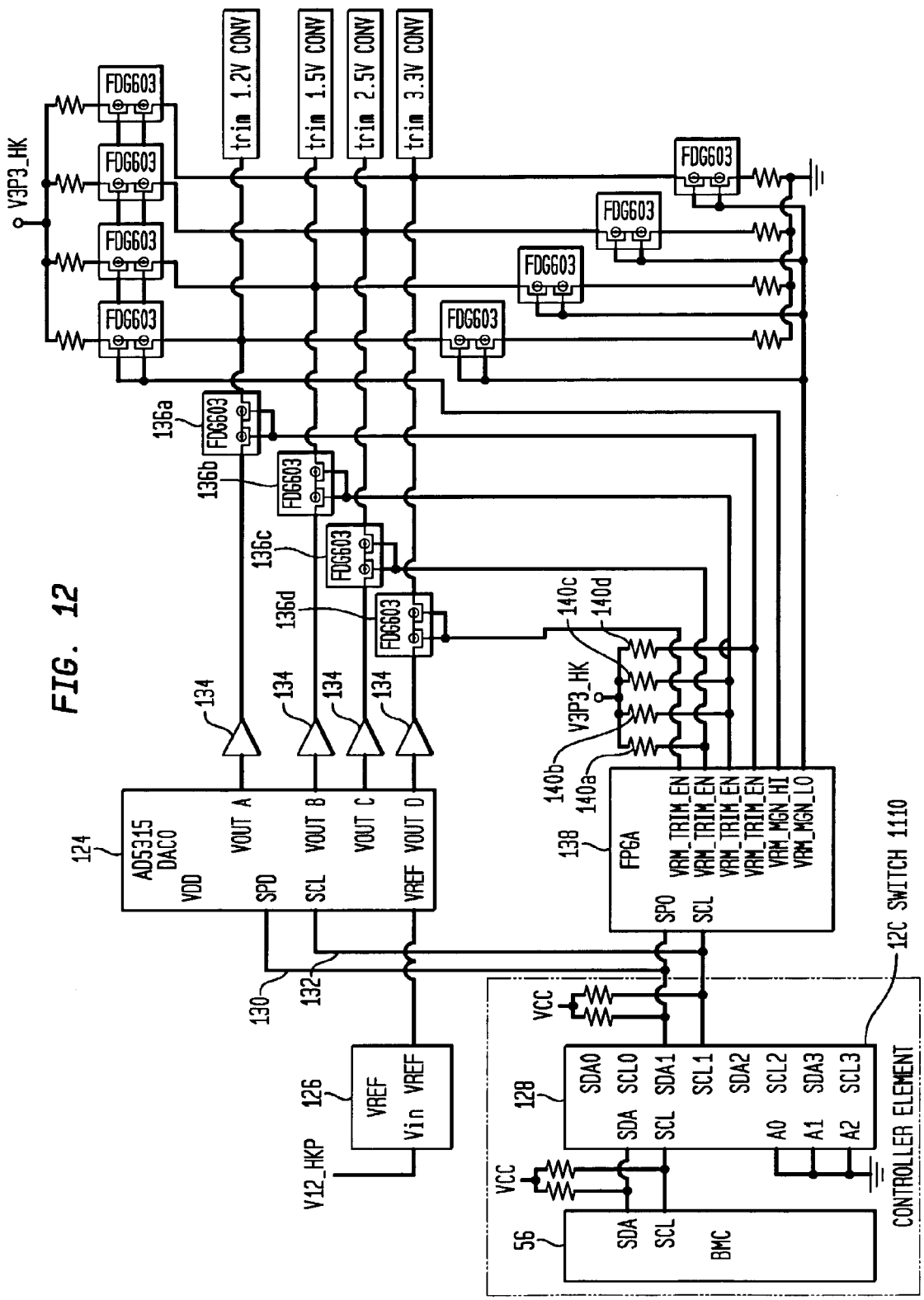

With reference to FIG. 12, another implementation of an embodiment of a voltage margin testing of the invention employs a digital-to-analog converter (DAC) 124 that can generate a plurality of voltage output values, such as exemplary outputs A, B, C, and D, for voltage margin testing of various power rails of a computer system under test. More particularly, the DAC 124 can receive a reference voltage from a reference voltage source 126, and can generate selected output voltage values, for example, in response to commands from the BMC 56. In this example, the DAC is selected to be an integrated circuit marketed by Analog devices corporation of Norwood, Mass., U.S.A under the designation AD5315. The DAC 124 can communicate with the BMC 56, via an I2C I/O expander switch 128, through serial bus lines 130 and 132 to receive instructions for setting one or more of the output voltages A-D to selected values for margin testing. Each output voltage of the DAC 124 can be coupled, for example, via amplifiers 134, to a switch, such as, switches (e.g., FETs) 136a, 136b, 136c, and 136d, herein collectively referred to as switches 136, that can be selectively activated via signals from a field programmable gate array (FPGA) 138 to provide a selected margin voltage. These switches are used to isolate the trim lines during nominal operation. Pull-up resistors 140a, 140b, 140c, and 140d are utilized to ensure that the switches 136 default to the nominal off state, thus guaranteeing isolation of the DAC analog outputs in case of part faults, firmware glitches power resets, etc. Under margin modes, the switches 136 are turned on and similar FET transmission switches are used to isolate the nominal-mode pull-up and pull-down resistors 140 that create appropriate voltage-divided trim inputs during nominal operation. In this exemplary embodiment, the margin voltages are selected to be 1.2 V, 1.5 V, 2.5 V, and 3.3 V. Those having ordinary skill in the art will appreciate that other values of margin voltages, and also more than four margin voltages, can be employed.

Those having ordinary skill in the art will appreciatete that various modifications can be made to the above embodiments without departing from the scope of the invention.

What is claimed is:

1. An electronic system comprising:
a host controller configured to execute an operating system and one or more management agents;
a plurality of components configured to provide functionality for the electronic system; and
a margin testing system integrated with said host controller and said plurality of components, said testing system configured for margin testing one or more of said plurality of components, said margin testing system comprising:
a baseboard management controller (BMC) configured to communicate with said host controller; and
a digital parameter adjuster configured to communicate with said BMC and configured to set at least one operating parameter associated with at least one of said plurality of components to one or more test values in response to commands from said BMC,
wherein said BMC is configured to monitor a response of the electronic system to said one or more test values.

2. The electronic system of claim 1, further comprising:
a hardware monitor configured to communicate with said BMC and at least one of said plurality of components to receive information from said at least one of said plurality of components in response to said one or more test values and to transmit said received information to said BMC.

3. The electronic system of claim 2, further comprising:
at least one communications bus configured to couple said BMC to said parameter adjuster and said hardware monitor.

4. The electronic system of claim 1, further comprising:
a diagnostics software configured to collect data regarding said response of the electronic system to said one or more test values.

5. The electronic system of claim 4, wherein said BMC is configured to execute said diagnostics software.

6. The electronic system of claim 1, wherein said BMC is further configured to transmit one or more command signals to said parameter adjuster to effect variation of said at least one operating parameter.

7. The electronic system of claim 1, wherein said at least one operating parameter comprises a frequency at which a clock signal is applied to said at least one of said plurality of components.

8. The electronic system of claim 1, wherein said BMC is configured to implement management of said plurality of components of the electronic system.

9. The electronic system of claim 1, wherein said BMC is configured to implement Intelligent Platform Management Interface (IPMI) protocol.

10. The electronic system of claim 1, further comprising:
an Inter-Integrated Circuit-based bus configured to provide communication between said BMC and said parameter adjuster.

11. The electronic system of claim 10, wherein said Inter-Integrated Circuit-based bus comprises an Intelligent Platform Management Bus (IPMB).

12. The electronic system of claim 1, wherein said parameter adjuster comprises a digital programmable frequency synthesizer.

13. The electronic system of claim 12, wherein said frequency synthesizer is configured to receive an input reference clock signal and, in response to a command signal from said BMC, generates an output clock signal as a multiple of said input clock signal.

14. The electronic system of claim 13, wherein said frequency synthesizer is configured to apply said output clock signal to one or more of said plurality of components for testing thereof.

15. The electronic system of claim 1, wherein the electronic system comprises a computer system.

16. The electronic system of claim 15, wherein said computer system comprises a computer server.

* * * * *

UNITED STATES PATENT AND TRADEMARK OFFICE
CERTIFICATE OF CORRECTION

PATENT NO.         : 7,493,226 B2
APPLICATION NO. : 10/606714
DATED              : February 17, 2009
INVENTOR(S)        : Naysen Jesse Robertson et al.

It is certified that error appears in the above-identified patent and that said Letters Patent is hereby corrected as shown below:

In column 1, line 16, delete "10/606,713" and insert -- 10/606,715 --, therefor.

Signed and Sealed this

Nineteenth Day of May, 2009

JOHN DOLL
*Acting Director of the United States Patent and Trademark Office*